United States Patent
Shioda et al.

(10) Patent No.: US 8,785,943 B2
(45) Date of Patent: Jul. 22, 2014

(54) NITRIDE SEMICONDUCTOR DEVICE, NITRIDE SEMICONDUCTOR WAFER, AND METHOD FOR MANUFACTURING NITRIDE SEMICONDUCTOR LAYER

(75) Inventors: Tomonari Shioda, Kanagawa-ken (JP); Hung Hung, Kanagawa-ken (JP); Jongil Hwang, Kanagawa-ken (JP); Hisashi Yoshida, Kanagawa-ken (JP); Naoharu Sugiyama, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 176 days.

(21) Appl. No.: 13/407,169

(22) Filed: Feb. 28, 2012

(65) Prior Publication Data

US 2013/0062612 A1    Mar. 14, 2013

(30) Foreign Application Priority Data

Sep. 8, 2011 (JP) .................. 2011-196341
Dec. 9, 2011 (JP) .................. 2011-269872

(51) Int. Cl.
*H01L 29/20* (2006.01)

(52) U.S. Cl.
USPC ...................... 257/76; 257/E29.089

(58) Field of Classification Search
USPC ............... 257/76, E29.089, E21.09; 438/478
See application file for complete search history.

(56) References Cited

U.S. PATENT DOCUMENTS

| 7,312,480 | B2 * | 12/2007 | Hata et al. ..................... 257/102 |
| 2004/0012015 | A1 * | 1/2004 | Saxler ............................ 257/18 |
| 2008/0217645 | A1 * | 9/2008 | Saxler et al. .................. 257/101 |
| 2012/0003821 | A1 * | 1/2012 | Yui et al. ....................... 438/478 |

FOREIGN PATENT DOCUMENTS

| JP | 2003-234501 | 8/2003 |
| JP | 2004-296717 | 10/2004 |
| JP | 2007-67077 | 3/2007 |
| JP | 2008-166349 | 7/2008 |
| JP | 2011-23642 | 2/2011 |

OTHER PUBLICATIONS

U.S. Appl. No. 13/602,868, filed Sep. 4, 2012, Hikosaka, et al.
U.S. Appl. No. 13/604,183, filed Sep. 5, 2012, Hikosaka, et al.
U.S. Appl. No. 13/868,275, filed Apr. 23, 2013, Harada, et al.
U.S. Appl. No. 13/222,561, filed Aug. 31, 2011, Tomonari Shioda, et al.
U.S. Appl. No. 13/222,200, filed Aug. 31, 2011, Tomonari Shioda, et al.
Notification of Reason(s) for Refusal issued Jun. 21, 2012 in Japanese Patent Application No. 2011-269872 (with English translation).

\* cited by examiner

*Primary Examiner* — Roy Potter
(74) *Attorney, Agent, or Firm* — Oblon, Spivak, McClelland, Maier & Neustadt, L.L.P.

(57) ABSTRACT

According to one embodiment, a nitride semiconductor device includes a foundation layer, a first stacked intermediate layer, and a functional layer. The foundation layer includes an AlN buffer layer formed on a substrate. The first stacked intermediate layer is provided on the foundation layer. The first stacked intermediate layer includes a first AlN intermediate layer provided on the foundation layer, a first AlGaN intermediate layer provided on the first AlN intermediate layer, and a first GaN intermediate layer provided on the first AlGaN intermediate layer. The functional layer is provided on the first stacked intermediate layer. The first AlGaN intermediate layer includes a first step layer in contact with the first AlN intermediate layer. An Al composition ratio in the first step layer decreases stepwise in a stacking direction from the first AlN intermediate layer toward the first step layer.

33 Claims, 16 Drawing Sheets

US 8,785,943 B2

NITRIDE SEMICONDUCTOR DEVICE, NITRIDE SEMICONDUCTOR WAFER, AND METHOD FOR MANUFACTURING NITRIDE SEMICONDUCTOR LAYER

CROSS-REFERENCE TO RELATED APPLICATIONS

This application is based upon and claims the benefit of priority from the prior Japanese Patent Application No. 2011-196341, filed on Sep. 8, 2011 and the prior Japanese patent Application No. 2011-269872, filed on Dec. 9, 2011; the entire contents of which are incorporated herein by reference.

FIELD

Embodiments described herein relate generally to a nitride semiconductor device, a nitride semiconductor wafer, and a method for manufacturing a nitride semiconductor layer.

BACKGROUND

Light emitting diodes (LED) are semiconductor light emitting devices based on nitride semiconductor, and are used in e.g. display devices and illumination. Electronic devices based on nitride semiconductor are used in high speed electronic devices and power devices.

Such nitride semiconductor devices can be formed on a silicon (Si) substrate, which is superior in mass productivity. However, in this case, defects and cracks are likely to occur due to the difference in lattice constant or thermal expansion coefficient. A technique for fabricating a high quality crystal on a silicon substrate is desired.

DETAILED DESCRIPTION

Figure 1:
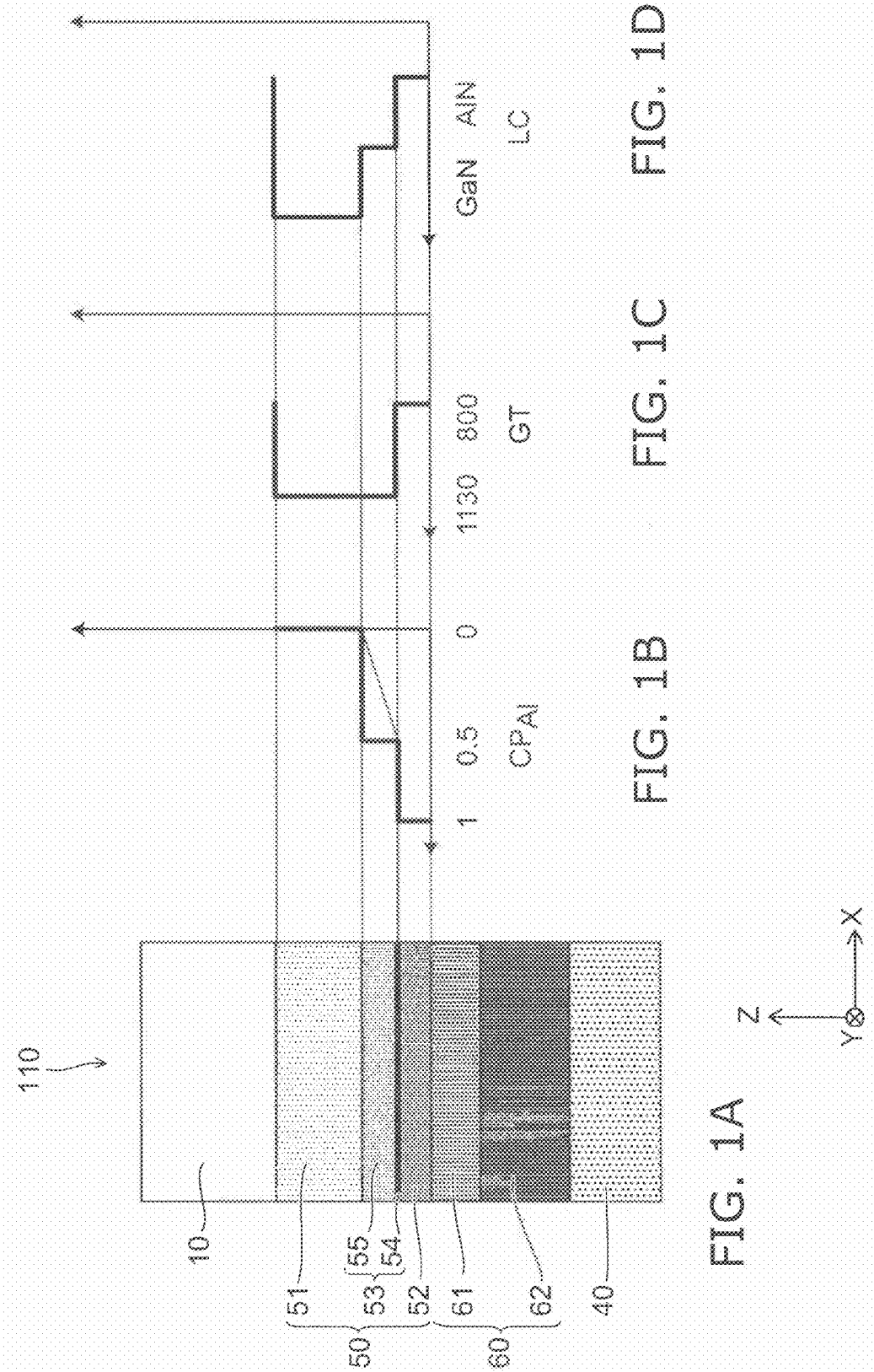
FIG. 1A to FIG. 1D are schematic views illustrating a nitride semiconductor device according to a first embodiment.

According to one embodiment, a nitride semiconductor device includes a foundation layer, a first stacked intermediate layer, and a functional layer. The foundation layer includes an AlN buffer layer formed on a substrate. The first stacked intermediate layer is provided on the foundation layer. The first stacked intermediate layer includes a first AlN intermediate layer provided on the foundation layer, a first AlGaN intermediate layer provided on the first AlN intermediate layer, and a first GaN intermediate layer provided on the first AlGaN intermediate layer. The functional layer is provided on the first stacked intermediate layer. The first AlGaN intermediate layer includes a first step layer in contact with the first AlN intermediate layer. An Al composition ratio in the first step layer decreases stepwise in a stacking direction from the first AlN intermediate layer toward the first step layer.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

The embodiment relates to a nitride semiconductor device. The nitride semiconductor device according to the embodiment includes such semiconductor devices as a semiconductor light emitting device, a semiconductor light receiving device, and an electronic device. The semiconductor light emitting device includes e.g. a light emitting diode (LED) and a laser diode (LD). The semiconductor light receiving device includes e.g. a photodiode (PD). The electronic device includes e.g. a high electron mobility transistor (HEMT), a heterojunction bipolar transistor (HBT), a field effect transistor (FET), and a Schottky barrier diode (SBD).

FIG. 1A to FIG. 1D are schematic views illustrating a nitride semiconductor device according to the first embodiment.

FIG. 1A is a schematic sectional view illustrating the configuration of the nitride semiconductor device according to the first embodiment. FIG. 1B is a graph illustrating the Al composition ratio ($CP_{Al}$) in the stacked intermediate layer. FIG. 1C is a graph illustrating the growth temperature GT in the stacked intermediate layer. FIG. 1D is a graph illustrating the a-axis lattice constant LC in the stacked intermediate layer.

As shown in FIG. 1A to FIG. 1D, the nitride semiconductor device 110 according to the embodiment includes a functional layer 10. The thickness of the functional layer 10 is e.g. approximately 2.1 micrometers (μm). The functional layer 10 is provided on a stacked intermediate layer 50. The stacked intermediate layer 50 is provided on a foundation layer 60 formed on a silicon substrate 40. The silicon substrate 40 is e.g. a Si(111) substrate. However, in the embodiment, the surface orientation of the silicon substrate 40 is not limited to the (111) plane. Furthermore, the silicon substrate 40 may be a substrate including an oxide layer. For instance, the silicon substrate 40 may be e.g. a silicon-on-insulator (SOI) substrate. Moreover, the silicon substrate 40 only needs to be a substrate including a material having a lattice constant different from the lattice constant of the functional layer 10 or a material having a thermal expansion coefficient different from the thermal expansion coefficient of the functional layer 10. For instance, the silicon substrate 40 may be a sapphire, spinel, GaAs, InP, ZnO, Ge, SiGe, or SiC substrate. The nitride semiconductor device 110 according to the embodiment may be used in the state in which the silicon substrate 40, the foundation layer 60, the stacked intermediate layer 50, and part of the functional layer 10 are removed. In the case where the nitride semiconductor device 110 is a light emitting device, the functional layer 10 includes e.g. an n-type semiconductor layer, a light emitting layer, and a p-type semiconductor layer.

The foundation layer 60 includes an AlN buffer layer 62 and a GaN foundation layer 61.

The thickness of the AlN buffer layer 62 is e.g. approximately 30 nanometers (nm). AlN is less likely to chemically react with the silicon substrate 40. By using AlN for the AlN buffer layer 62 in contact with Si, the problem such as meltback etching is easily solved.

The thickness of the GaN foundation layer 61 is e.g. approximately 300 nm. By providing the GaN foundation layer 61 on the AlN buffer layer 62, compressive strain is likely to occur during crystal growth of the stacked intermediate layer 50. This can suppress the generation of cracks. Here, the GaN foundation layer 61 is provided as necessary, and may be omitted as the case may be.

The stacked intermediate layer 50 includes a GaN intermediate layer 51, an AlGaN-based intermediate layer. The AlGaN-based intermediate layer includes an AlN intermediate layer 52, and an AlGaN intermediate layer 53. The GaN intermediate layer 51 is provided on the AlGaN intermediate layer 53. The AlGaN intermediate layer 53 is provided on the AlN intermediate layer 52. That is, the AlGaN intermediate layer 53 is provided between the GaN intermediate layer 51 and the AlN intermediate layer 52.

Here, the direction from the stacked intermediate layer 50 toward the functional layer 10 is taken as the Z-axis direction. One axis perpendicular to the Z axis is taken as the X axis. The direction perpendicular to the Z axis and the X axis is taken as the Y axis. The functional layer 10 is stacked on the stacked intermediate layer 50 along the Z axis.

In the description, the term "stacked" refers not only to the case where layers are stacked in contact with each other, but also to the case where the layers are stacked with another layer interposed therebetween. The term "provided on" refers not only to the case of being provided in direct contact, but also to the case of being provided with another layer interposed in between.

In the stacked intermediate layer 50 of the embodiment, the lattice constant parallel to the stacking direction (Z-axis direction) varies along the stacking direction from the lattice constant of AlN not affected by strain to the lattice constant of GaN.

More specifically, as shown in FIG. 1A, the AlN intermediate layer 52 is formed on the GaN foundation layer 61. The crystal growth temperature of the AlN intermediate layer 52 is preferably e.g. 500° C. or more and 1050° C. or less. If the growth temperature (formation temperature) of the AlN intermediate layer 52 is lower than 500° C., impurity is easily incorporated. Furthermore, cubic AlN and the like are grown, and crystal dislocations excessively occur. Thus, the crystal quality of the AlN intermediate layer 52 is excessively degraded. On the other hand, if the formation temperature of the AlN intermediate layer 52 is higher than 1050° C., lattice relaxation is less likely to occur. Thus, the strain is not relaxed, and tensile strain is easily introduced into the silicon substrate 40. Furthermore, when the crystal of the AlGaN intermediate layer 53 and the GaN intermediate layer 51 is grown on the AlN intermediate layer 52, compressive strain cannot be appropriately applied thereto. Thus, at the time of decreasing the temperature after crystal growth, cracks are likely to occur.

In contrast, as shown in FIG. 1C, if the formation temperature of the AlN intermediate layer 52 is e.g. 800° C., lattice relaxation of AlN intermediate layer 52 is easily occurred. Thus, from the initial phase of forming the AlN intermediate layer 52, the AlN intermediate layer 52 is less likely to undergo tensile strain from the GaN foundation layer 61 serving as a foundation. As a result, the AlN intermediate layer 52 can be formed so as to avoid the influence of strain from the GaN foundation layer 61 serving as a foundation. Thus, the lattice-relaxed AlN intermediate layer 52 is formed on the GaN foundation layer 61.

The thickness of the AlN intermediate layer 52 is preferably e.g. 5 nanometers (nm) or more and 100 nm or less. If the thickness of the AlN intermediate layer 52 is thinner than 5 nm, AlN is less likely to be sufficiently relaxed. If the thickness of the AlN intermediate layer 52 is thicker than 100 nm, the crystal quality of the AlN intermediate layer 52 is likely to be degraded. For instance, dislocations due to lattice relaxation are increased. More preferably, the thickness of the AlN intermediate layer 52 is 50 nm or less. When the thickness of the AlN intermediate layer 52 is 50 nm or less, the degradation of crystal quality is further suppressed. The thickness of the AlN intermediate layer 52 is e.g. approximately 12 nm.

Next, an AlGaN intermediate layer 53 having a larger lattice constant than AlN is formed on the AlN intermediate layer 52. The thickness of the AlGaN intermediate layer 53 is preferably e.g. 5 nm or more and 2000 nm or less. If the thickness of the AlGaN intermediate layer 53 is thinner than 5 nm, it is difficult to achieve the effect of suppressing the generation of cracks and the effect of reducing dislocations. If the thickness of the AlGaN intermediate layer 53 is thicker than 2000 nm, the effect of reducing dislocations is saturated, and furthermore, cracks are likely to occur. More preferably, the thickness of the AlGaN intermediate layer 53 is less than 100 nm. By setting the thickness of the AlGaN intermediate layer 53 to less than 100 nm, the dislocation density can be effectively reduced. The thickness of the AlGaN intermediate layer 53 is e.g. approximately 13 nm.

In the state of thin thickness, i.e., in the initial phase of growth, $Al_xGa_{1-x}N$ is formed in lattice matching with the lattice constant of AlN, and grown under compressive strain. With the progress of the growth of $Al_xGa_{1-x}N$, the strain is gradually relaxed. Thus, $Al_xGa_{1-x}N$ comes to have the lattice constant of $Al_xGa_{1-x}N$ free from strain. When $Al_xGa_{1-x}N$ is grown under compressive strain, the compressive strain is accumulated at the substrate surface, and upward convex warpage occurs in the substrate. Thus, compressive strain is previously accumulated during crystal growth. This can suppress the generation of cracks resulting from thermal expansion coefficient difference at the time of decreasing the temperature after the completion of the growth. Cracks and dislocations can be reduced by controlling the Al composition ratio, which reflects the size of compressive strain, and the film thickness.

As shown in FIG. 1B, the Al composition ratio $CP_{Al}$ (X) in the AlGaN intermediate layer 53 is e.g. 0.5. That is, as the AlGaN intermediate layer 53, for instance, an $Al_{0.5}Ga_{0.5}N$ layer is used. However, in the embodiment, the Al composition ratio $CP_{Al}$ in the AlGaN intermediate layer 53 is not limited thereto, but may be e.g. 0.75. The Al composition ratio $CP_{Al}$ in the AlGaN intermediate layer 53 is described later in detail.

In the embodiment, as shown in FIG. 1B, the Al composition ratio in the stacked intermediate layer 50 is varied incrementally. Furthermore, as shown in FIG. 1D, the a-axis lattice constant LC in the stacked intermediate layer 50 is varied incrementally. However, the Al composition ratio in the stacked intermediate layer 50 is not limited to incremental variation. The AlGaN intermediate layer 53 may include a gradient layer in which the Al composition ratio continuously diminishes or decreases from AlN toward GaN.

More specifically, as shown in FIG. 1A, the AlGaN intermediate layer 53 includes a step layer 54 in contact with the AlN intermediate layer 52. As shown in FIG. 1B, the Al composition ratio in the step layer 54 decreases stepwise in the stacking direction. Furthermore, the AlGaN intermediate layer 53 may include a gradient layer 55 in which the Al composition ratio gradually decreases in the stacking direction like the double-dot dashed line shown in FIG. 1B. The gradient layer 55 is provided on the step layer 54.

In the case where the gradient layer 55 is not provided, the Al composition ratio $CP_{Al}$ in the stacked intermediate layer 50 decreases incrementally in the stacking direction. In this case, the number of step layers 54 formed is not limited to one, but may be a plurality. For instance, the AlGaN intermediate layer 53 may include an $Al_{0.75}Ga_{0.25}N$ layer, an $Al_{0.5}Ga_{0.5}N$ layer, and an $Al_{0.25}Ga_{0.75}N$ layer. In this case, the $Al_{0.75}Ga_{0.25}N$ layer, the $Al_{0.5}Ga_{0.5}N$ layer, and the $Al_{0.25}Ga_{0.75}N$ layer are stacked in this order in the stacking direction so that the Al composition ratio decreases stepwise in the stacking direction. The film thickness of each layer may be equal or different among the layers. For instance, an $Al_{0.75}Ga_{0.25}N$ layer of 33 nm, an $Al_{0.5}Ga_{0.5}N$ layer of 33 nm, and an $Al_{0.25}Ga_{0.75}N$ layer of 33 nm may be stacked in this order. Alternatively, an $Al_{0.75}Ga_{0.25}N$ layer of 13 nm, an $Al_{0.5}Ga_{0.5}N$ layer of 33 nm, and an $Al_{0.25}Ga_{0.75}N$ layer of 53 nm may be stacked in this order. Thus, dislocation reduction effects corresponding to different Al composition ratios and film thicknesses can be combined.

As shown in FIG. 1C, the formation temperature of the AlGaN intermediate layer 53 is e.g. approximately 1130° C. If the formation temperature of the AlGaN intermediate layer 53 is 80° C. or more higher than the formation temperature of the AlN intermediate layer 52, the effect of growing in lattice matching with the lattice constant of AlN is achieved more significantly. For instance, when the formation temperature of the AlGaN intermediate layer 53 is 1050° C. or more, the thickness grown in lattice matching is increased. As a result, compressive strain is easily applied, and the generation of cracks is easily suppressed. Furthermore, the effect of reducing dislocations is achieved more significantly.

Next, on the strain-relaxed AlGaN intermediate layer 53, a GaN intermediate layer 51 having a larger lattice constant than the AlGaN intermediate layer 53 is formed. In the initial phase of growth, the GaN intermediate layer 51 is formed in lattice matching with the lattice constant of $Al_xGa_{1-x}N$, and grown under compressive strain. With the progress of the growth of GaN, the strain is gradually relaxed. Thus, the lattice constant of GaN returns to the lattice constant of GaN free from strain.

As shown in FIG. 1C, the formation temperature of the GaN intermediate layer 51 is e.g. approximately 1130° C. If the formation temperature of the GaN intermediate layer 51 is 80° C. or more higher than the formation temperature of the AlN intermediate layer 52, the thickness grown in lattice matching with the lattice constant of $Al_xGa_{1-x}N$ is increased. For instance, when the formation temperature of the GaN intermediate layer 51 is 1050° C. or more, the coherent growth thickness is increased. As a result, compressive strain is easily applied during crystal growth of the GaN intermediate layer 51. Thus, the effect of suppressing the generation of cracks is achieved more significantly. The thickness of the GaN intermediate layer 51 is e.g. approximately 260 nm.

The total thickness of the AlN intermediate layer 52, the AlGaN intermediate layer 53, and the GaN intermediate layer 51 is preferably e.g. 50 nm or more and 2000 nm or less. If the total thickness of the AlN intermediate layer 52, the AlGaN intermediate layer 53, and the GaN intermediate layer 51 is less than 50 nm, this excessively increases the temperature increasing process and temperature decreasing process of growth temperature for obtaining a certain thickness of the stacked intermediate layer. Thus, the productivity is deteriorated. On the other hand, if the total thickness of the AlN intermediate layer 52, the AlGaN intermediate layer 53, and the GaN intermediate layer 51 is thicker than 2000 nm, the accumulation of compressive strain is made insufficient, and cracks are likely to occur. More preferably, the total thickness of the AlN intermediate layer 52, the AlGaN intermediate layer 53, and the GaN intermediate layer 51 is 300 nm or more and less than 1000 nm. By setting the total thickness of the AlN intermediate layer 52, the AlGaN intermediate layer 53, and the GaN intermediate layer 51 to 300 nm or more and less than 1000 nm, a flat surface is easily obtained, and the effect of reducing cracks and dislocations is easily achieved.

Here, a Si δ-doped layer, not shown, may be provided in a portion of the GaN intermediate layer 51 except the neighborhood of the boundary with the functional layer 10. Alternatively, a Si δ-doped layer, not shown, may be provided in part of the AlGaN intermediate layer 53. These configurations can provide a nitride semiconductor device formed on a silicon substrate, including few cracks, and having high quality.

Thus, in the nitride semiconductor device 110 according to the embodiment, a functional layer 10 is provided on a stacked intermediate layer 50. The stacked intermediate layer 50 is provided on a foundation layer 60 formed on a silicon substrate 40. The stacked intermediate layer 50 has a structure in which an AlN intermediate layer 52, an AlGaN intermediate layer 53, and a GaN intermediate layer 51 are stacked in this order. The AlGaN intermediate layer 53 includes a step layer 54 in which the Al composition ratio decreases stepwise in the stacking direction, i.e., from the AlN intermediate layer 52 toward the GaN intermediate layer 51. Thus, the effect of suppressing the generation of cracks by applying compressive strain during crystal growth is achieved. Furthermore, the effect of reducing dislocations is achieved. Thus, cracks, dislocations and the like in the functional layer 10 are reduced.

FIG. 2A to FIG. 2D are schematic views illustrating an alternative nitride semiconductor device according to the first embodiment.

Figure 2:
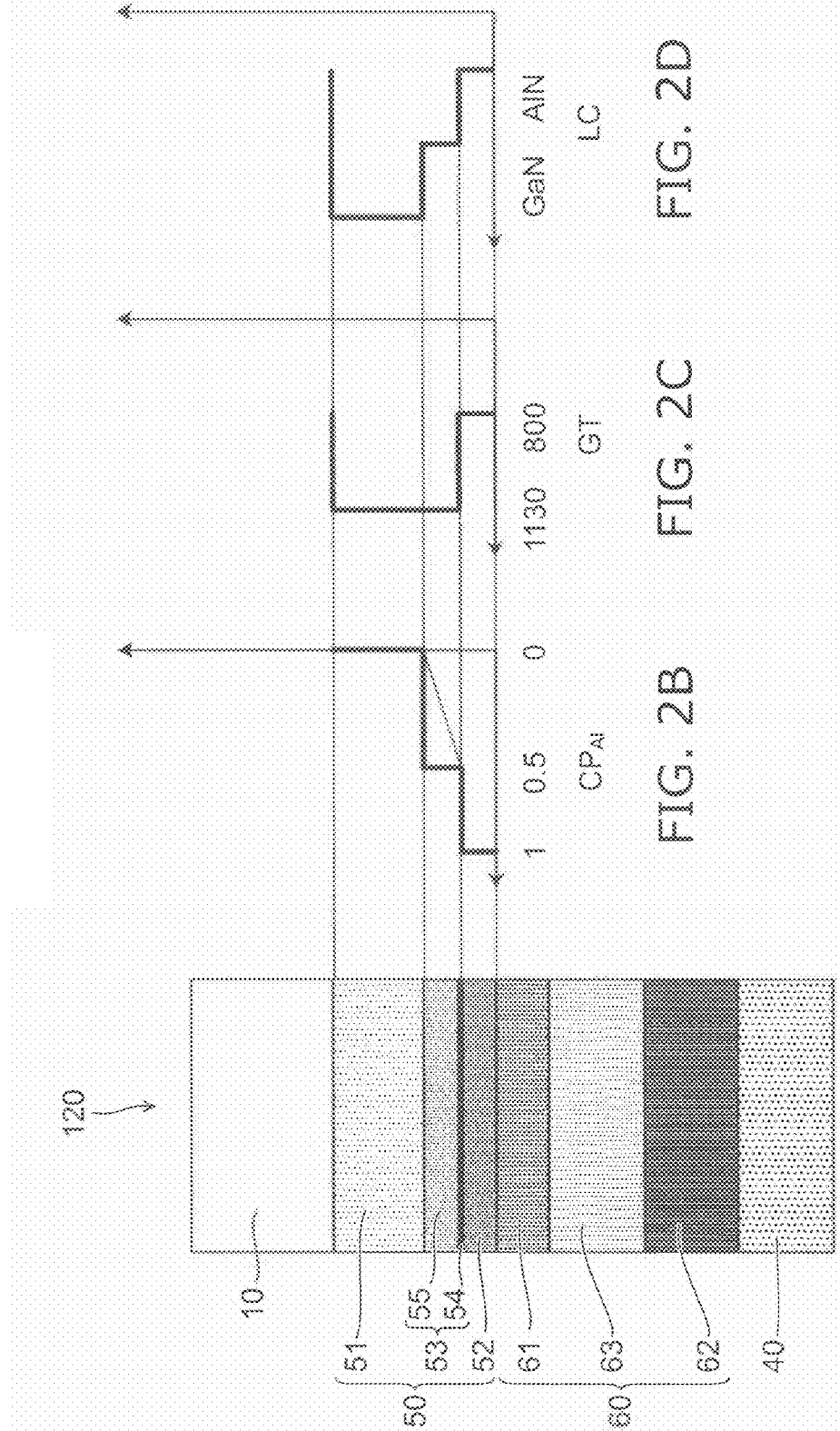
FIG. 2A to FIG. 2D are schematic views illustrating an alternative nitride semiconductor device according to the first embodiment.

FIG. 2A is a schematic sectional view illustrating the configuration of the alternative nitride semiconductor device according to the first embodiment. FIG. 2B to FIG. 2D are as described above with reference to FIG. 1B to FIG. 1D.

As shown in FIG. 2A, the nitride semiconductor device 120 according to the embodiment is different from the nitride semiconductor device 110 described above with reference to FIGS. 1A to 1D in further including an AlGaN foundation layer 63. The AlGaN foundation layer 63 is provided between the GaN foundation layer 61 and the AlN buffer layer 62. That is, the foundation layer 60 includes the AlN buffer layer 62, the AlGaN foundation layer 63, and the GaN foundation layer 61. The remaining structure is similar to the structure of the nitride semiconductor device 110 described above with reference to FIG. 1A to FIG. 1D.

The Al composition ratio $CP_{Al}$ in the AlGaN foundation layer 63 is e.g. 0.75. That is, as the AlGaN foundation layer 63, for instance, an $Al_{0.75}Ga_{0.25}N$ layer is used. The thickness of the AlGaN foundation layer 63 is e.g. approximately 13 nm. Thus, the effect of suppressing the generation of cracks by applying compressive strain during crystal growth of the foundation layer 60 is achieved. Furthermore, the effect of reducing dislocations is achieved. Thus, the foundation layer 60 including few cracks and dislocations can be formed.

FIG. 3A to FIG. 3D are schematic views illustrating a further alternative nitride semiconductor device according to the first embodiment.

Figure 3:
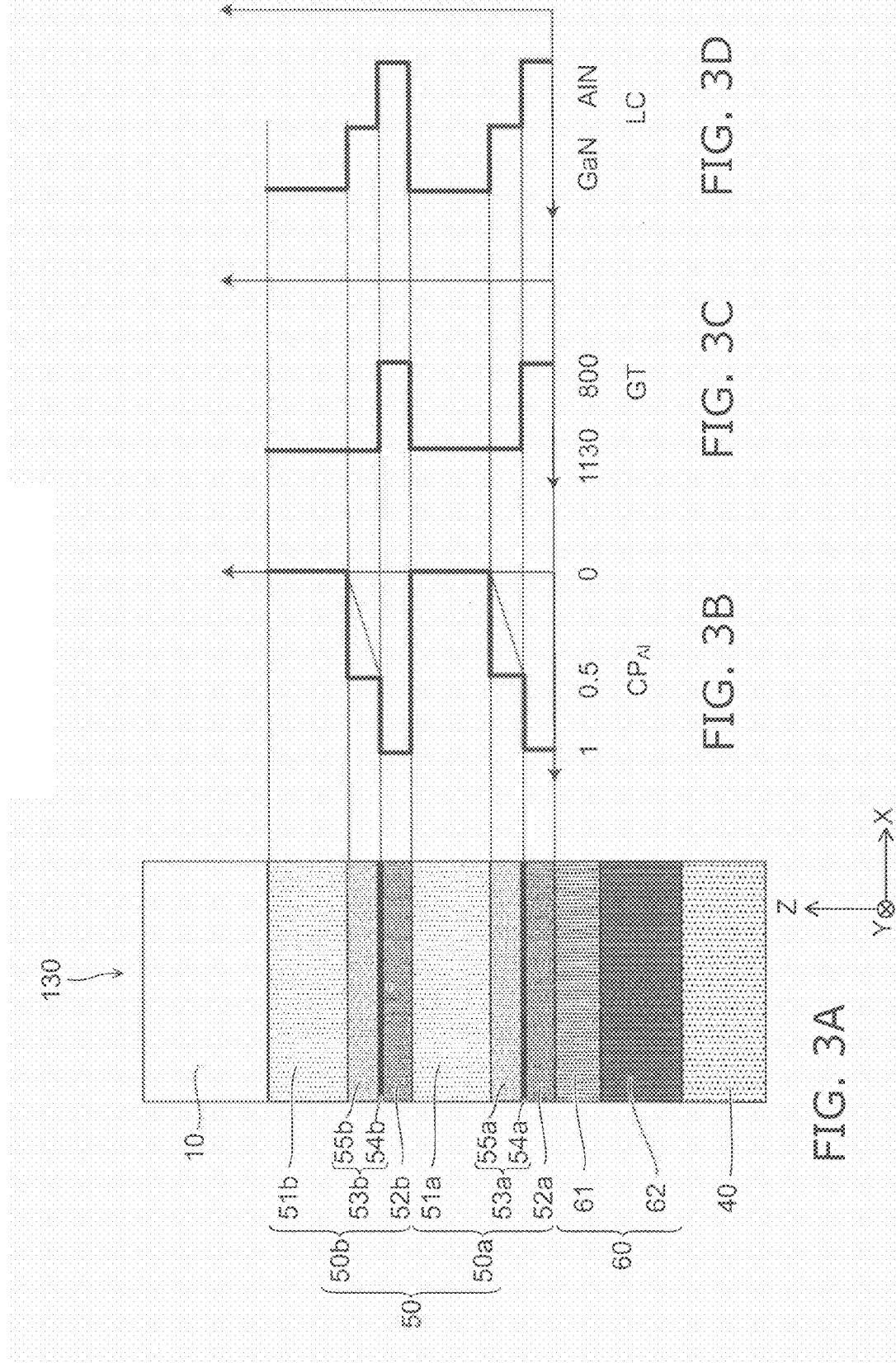
FIG. 3A to FIG. 3D are schematic views illustrating a further alternative nitride semiconductor device according to the first embodiment.

FIG. 3A is a schematic sectional view illustrating the configuration of the further alternative nitride semiconductor device according to the first embodiment. FIG. 3B to FIG. 3D are as described above with reference to FIG. 1B to FIG. 1D.

As shown in FIG. 3A, in the nitride semiconductor device 130 according to the embodiment, the stacked intermediate layer 50 includes a plurality of GaN intermediate layers 51, a plurality of AlN intermediate layers 52, and a plurality of AlGaN intermediate layers 53. Each of the plurality of GaN intermediate layers 51 is similar to the GaN intermediate layer 51 described above with reference to FIG. 1A to FIG. 1D. Each of the AlN intermediate layers 52 is similar to the AlN intermediate layer 52 described above with reference to FIG. 1A to FIG. 1D. Each of the plurality of AlGaN intermediate layers 53 is similar to the AlGaN intermediate layer 53 described above with reference to FIG. 1A to FIG. 1D.

In the nitride semiconductor device 130 according to the embodiment, the number of GaN intermediate layers 51, the number of AlN intermediate layers 52, and the number of AlGaN intermediate layers 53 (i.e., the number of periods) are each 2. In other words, the stacked body including one AlN intermediate layer 52, one AlGaN intermediate layer 53 formed on the AlN intermediate layer 52, and one GaN intermediate layer 51 formed on the AlGaN intermediate layer 53 is treated as one period. Then, in the nitride semiconductor device 130 according to the embodiment, the number of periods of stacked bodies is 2. However, the embodiment is not limited thereto. The number of periods of stacked bodies may be e.g. 3 or more. That is, in the nitride semiconductor device 130 according to the embodiment, the stacked intermediate layer 50 has a structure in which the AlN intermediate layer 52, the AlGaN intermediate layer 53, and the GaN intermediate layer 51 are periodically stacked a plurality of times in this order.

More specifically, a first stacked intermediate layer 50a is formed on the GaN foundation layer 61. A second stacked intermediate layer 50b is provided on the first stacked intermediate layer 50a. Then, the functional layer 10 is provided on the second stacked intermediate layer 50b. That is, the second stacked intermediate layer 50b is provided between the first stacked intermediate layer 50a and the functional layer 10.

The first stacked intermediate layer 50a is similar to the stacked intermediate layer 50 described above with reference to FIG. 1A to FIG. 1D. More specifically, the first stacked intermediate layer 50a includes a first GaN intermediate layer 51a, and a first AlGaN-based intermediate layer. The first AlGaN-based intermediate layer includes a first AlN intermediate layer 52a, and a first AlGaN intermediate layer 53a. The first GaN intermediate layer 51a, the first AlN intermediate layer 52a, and the first AlGaN intermediate layer 53a are similar to the GaN intermediate layer 51, the AlN intermediate layer 52, and the AlGaN intermediate layer 53, respectively, described above with reference to FIG. 1A to FIG. 1D. The first AlGaN intermediate layer 53a includes a first step layer 54a in which the Al composition ratio decreases stepwise in the stacking direction. The first AlGaN intermediate layer 53a may include a first gradient layer 55a in which the Al composition ratio gradually decreases in the stacking direction.

The second stacked intermediate layer 50b includes a second GaN intermediate layer 51b, and a second AlGaN-based intermediate layer. The second AlGaN-based intermediate layer includes a second AlN intermediate layer 52b, and a second AlGaN intermediate layer 53b. Like the first AlGaN intermediate layer 53a, the second AlGaN intermediate layer 53b includes a second step layer 54b in which the Al composition ratio decreases stepwise in the stacking direction. The second AlGaN intermediate layer 53b may include a second gradient layer 55b in which the Al composition ratio gradually decreases in the stacking direction. The remaining structure of the nitride semiconductor device 130 according to the embodiment is similar to the structure of the nitride semiconductor device 110 described above with reference to FIG. 1A to FIG. 1D. The second stacked intermediate layer 50b may be different from the first stacked intermediate layer 50a within the range of design guidelines of the stacked intermediate layer 50 described above with reference to FIG. 1A to FIG. 1D. For instance, the thickness of the second GaN intermediate layer 51b may be thicker than the thickness of the first GaN intermediate layer 51a. Thus, by varying the structure in response to the varied amount of strain accumulated with stacking, the effect of further reducing cracks and dislocations is achieved.

Also in the first stacked intermediate layer 50a and the second stacked intermediate layer 50b of the nitride semiconductor device 130 according to the embodiment, the lattice constant parallel to the stacking direction varies along the stacking direction from the lattice constant of AlN not affected by strain to the lattice constant of GaN.

That is, the formation condition, function, effect and the like of the first AlN intermediate layer 52a, the first AlGaN intermediate layer 53a, and the first GaN intermediate layer 51a in the first stacked intermediate layer 50a are similar to those of the AlN intermediate layer 52, the AlGaN intermediate layer 53, and the GaN intermediate layer 51 in the stacked intermediate layer 50 described above with reference to FIG. 1A to FIG. 1D.

Next, on the first GaN intermediate layer 51a of the first stacked intermediate layer 50a, the second AlN intermediate layer 52b of the second stacked intermediate layer 50b is formed. The thickness of the second AlN intermediate layer 52b is e.g. approximately 12 nm.

The crystal growth temperature of the second AlN intermediate layer 52b is preferably e.g. 500° C. or more and 1050° C. or less. As shown in FIG. 3C, the formation temperature of the second AlN intermediate layer 52b is e.g. 800° C. Thus, the second AlN intermediate layer 52b easily relaxed. Hence, as shown in FIG. 3D, compared with the lattice constant of AlGaN and the lattice constant of GaN, the lattice constant of AlN sharply returns to the lattice constant of AlN free from strain. Thus, from the initial phase of forming the second AlN intermediate layer 52b, the second AlN intermediate layer 52b is less likely to undergo tensile strain from the first GaN intermediate layer 51a serving as a foundation. As a result, the second AlN intermediate layer 52b can be formed so as to avoid the influence of strain from the first GaN intermediate layer 51a serving as a foundation. Thus, the sharply relaxed second AlN intermediate layer 52b is formed on the first GaN intermediate layer 51a.

Next, a second AlGaN intermediate layer 53b having a larger lattice constant than AlN is formed on the second AlN intermediate layer 52b. The thickness of the second AlGaN intermediate layer 53b is preferably e.g. 5 nm or more and 2000 nm or less. More preferably, the thickness of the second AlGaN intermediate layer 53b is less than 100 nm. By setting the thickness of the second AlGaN intermediate layer 53b to less than 100 nm, the dislocation density can be effectively reduced. The thickness of the second AlGaN intermediate layer 53b is e.g. approximately 13 nm.

As described above with reference to FIG. 1A to FIG. 1D, in the state of thin thickness, i.e., in the initial phase of growth, $Al_xGa_{1-x}N$ is coherently grown with the lattice constant of AlN, and grown under compressive strain. With the progress of the growth of $Al_xGa_{1-x}N$, the strain is gradually relaxed. Thus, $Al_xGa_{1-x}N$ comes to have the lattice constant of $Al_xGa_{1-x}N$ free from strain.

As shown in FIG. 3B, the Al composition ratio $CP_{Al}$ in the second AlGaN intermediate layer 53b is e.g. 0.5. That is, as the second AlGaN intermediate layer 53b, for instance, an $Al_{0.5}Ga_{0.5}N$ layer is used.

As shown in FIG. 3C, the formation temperature of the second AlGaN intermediate layer 53b is e.g. approximately 1130° C. If the formation temperature of the second AlGaN intermediate layer 53b is 80° C. or more higher than the formation temperature of the second AlN intermediate layer 52b, the effect of growing in lattice matching with the lattice constant of AlN is achieved more significantly. Furthermore, the effect of reducing dislocations is achieved more significantly. For instance, when the formation temperature of the second AlGaN intermediate layer 53b is 1050° C. or more, the thickness grown in lattice matching is increased.

Next, on the relaxed second AlGaN intermediate layer 53b, a second GaN intermediate layer 51b having a larger lattice constant than the second AlGaN intermediate layer 53b is formed. As described above with reference to FIG. 1A to FIG. 1D, in the initial phase of growth, the second GaN intermediate layer 51b is formed in lattice matching with the lattice constant of $Al_xGa_{1-x}N$, and grown under compressive strain. With the progress of the growth of GaN, the strain is gradually relaxed. Thus, the lattice constant of GaN returns to the lattice constant of GaN free from strain.

As shown in FIG. 3C, the formation temperature of the second GaN intermediate layer 51b is e.g. approximately 1130° C. If the formation temperature of the second GaN intermediate layer 51b is 80° C. or higher than the formation temperature of the second AlN intermediate layer 52b, the thickness grown in lattice matching with the lattice constant of $Al_xGa_{1-x}N$ is increased. For instance, when the formation temperature of the second GaN intermediate layer 51b is 1050° C. or more, the thickness grown in lattice matching is increased. As a result, compressive strain is easily applied during crystal growth of the second GaN intermediate layer 51b. Thus, the effect of suppressing the generation of cracks is achieved more significantly. The thickness of the second GaN intermediate layer 51b is e.g. approximately 260 nm.

Thus, the stacked intermediate layer 50 can have a structure in which the AlN intermediate layer 52, the AlGaN intermediate layer 53, and the GaN intermediate layer 51 are periodically stacked a plurality of times in this order. Then, the effect of suppressing the generation of cracks by applying compressive strain during crystal growth is achieved more significantly. Furthermore, the effect of reducing dislocations is achieved more significantly. Thus, cracks, dislocations and the like in the functional layer 10 are further reduced.

FIG. 4A to FIG. 4D are schematic views illustrating a further alternative nitride semiconductor device according to the first embodiment.

Figure 4:
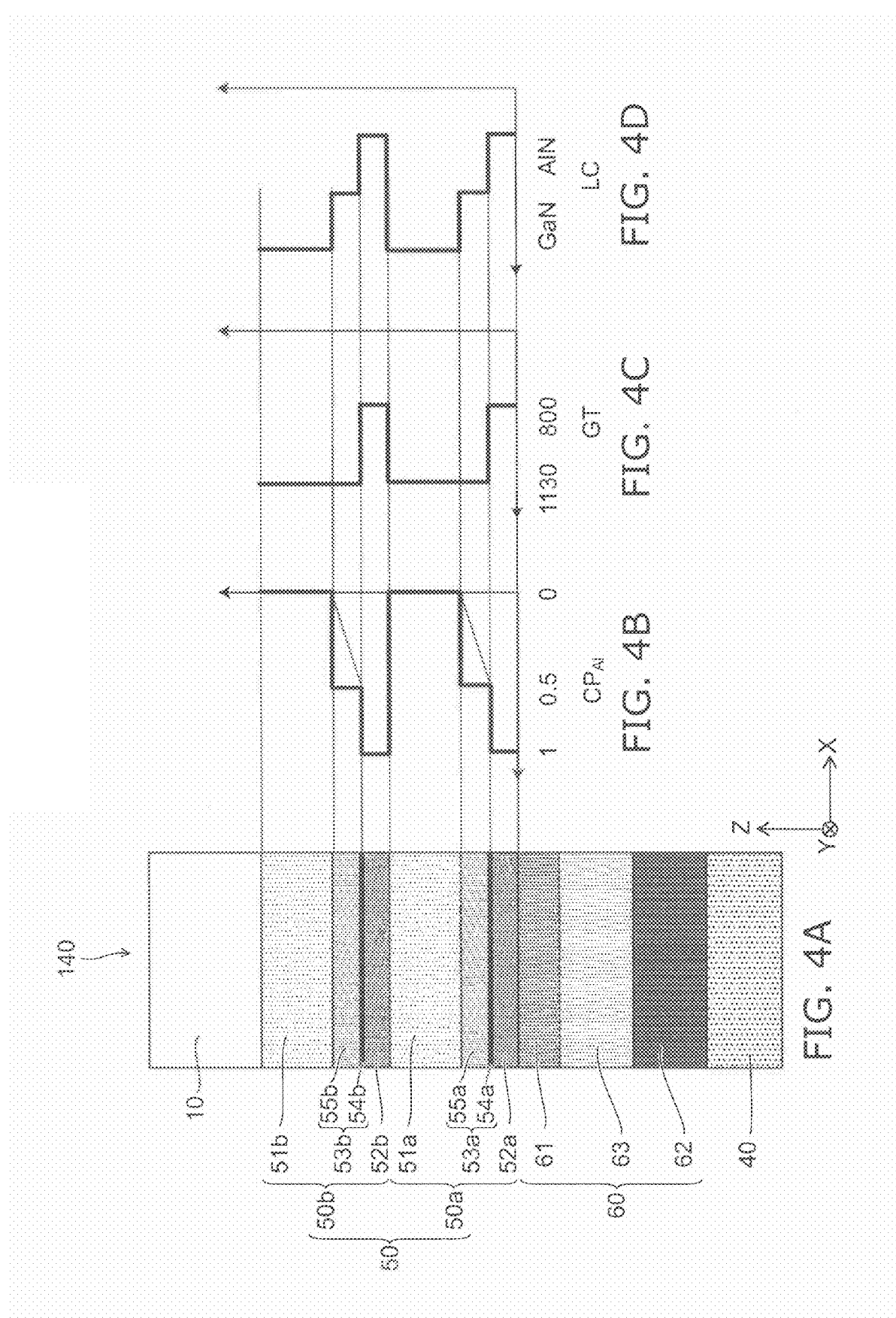
FIG. 4A to FIG. 4D are schematic views illustrating a further alternative nitride semiconductor device according to the first embodiment.

FIG. 4A is a schematic sectional view illustrating the configuration of the further alternative nitride semiconductor device according to the first embodiment. FIG. 4B to FIG. 4D are as described above with reference to FIG. 1B to FIG. 1D.

As shown in FIG. 4A, the nitride semiconductor device 140 according to the embodiment is different from the nitride semiconductor device 130 described above with reference to FIG. 3A to FIG. 3D in further including an AlGaN foundation layer 63. The AlGaN foundation layer 63 is provided between the GaN foundation layer 61 and the AlN buffer layer 62. That is, the foundation layer 60 includes the AlN buffer layer 62, the AlGaN foundation layer 63, and the GaN foundation layer 61. The remaining structure is similar to the structure of the nitride semiconductor device 130 described above with reference to FIG. 3A to FIG. 3D.

The Al composition ratio $CP_{Al}$ in the AlGaN foundation layer 63 is e.g. 0.75. That is, as the AlGaN foundation layer 63, for instance, an $Al_{0.75}Ga_{0.25}N$ layer is used. The thickness of the AlGaN foundation layer 63 is e.g. approximately 13 nm. Thus, as described above with reference to FIG. 2A to FIG. 2D, the effect of suppressing the generation of cracks by applying compressive strain during crystal growth of the foundation layer 60 is achieved. Furthermore, the effect of dislocation reduction is achieved. Thus, the foundation layer 60 including few cracks and dislocations can be formed.

Next, the characteristics of the nitride semiconductor device according to the embodiment are described with reference to the drawings.

Figure 5:
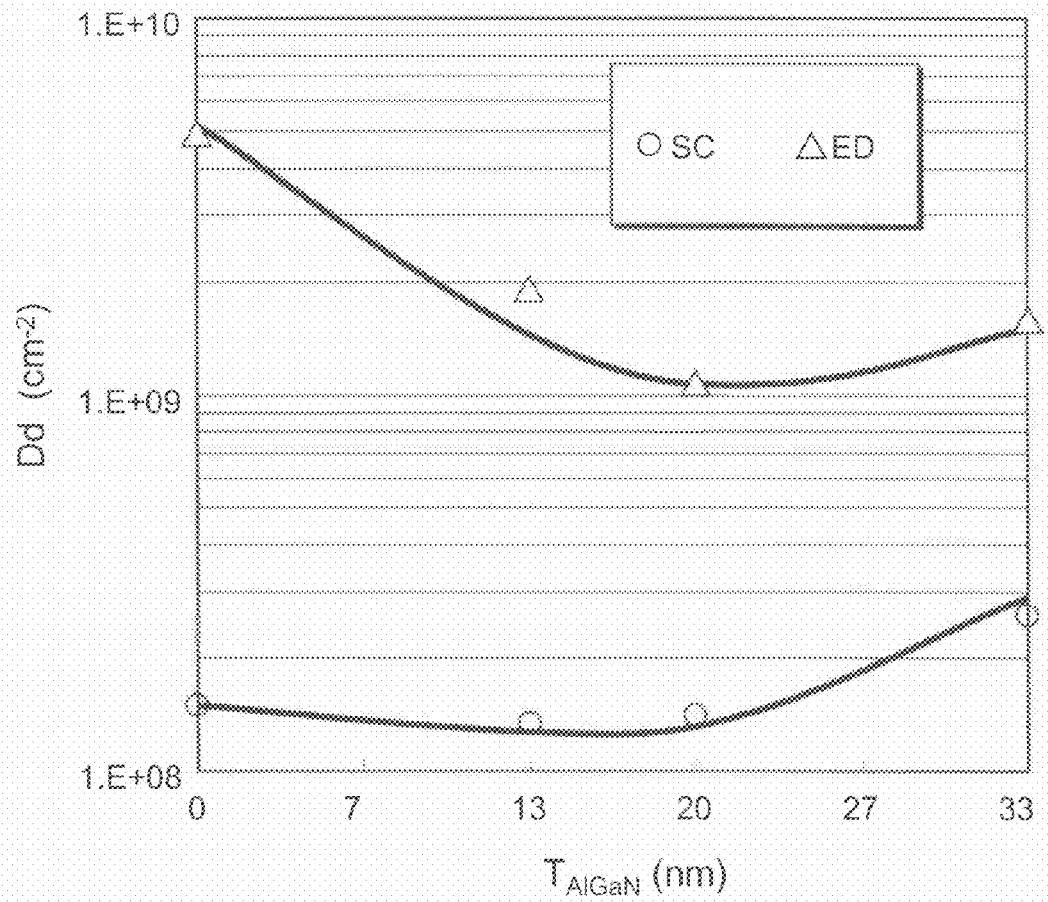
FIG. 5 is a graph illustrating an example relationship between the thickness $T_{AlGaN}$ of the AlGaN intermediate layer and the dislocation density Dd.

FIG. 5 is a graph illustrating an example relationship between the thickness $T_{AlGaN}$ of the AlGaN intermediate layer and the dislocation density Dd.

The inventors fabricated the following samples.

On a GaN layer as the GaN foundation layer 61, an AlN layer having a thickness of 12 nm was formed at 800° C. This AlN layer corresponds to the AlN intermediate layer 52.

Next, on the AlN layer, an $Al_{0.5}Ga_{0.5}N$ layer having a thickness of 0 nm, 13 nm, 20 nm, and 33 nm was formed at 1130° C. That is, the inventors fabricated four samples with the $Al_{0.5}Ga_{0.5}N$ layer having different thicknesses, and investigated the difference of the effect based on the difference of the thickness of the $Al_{0.5}Ga_{0.5}N$ layer. The $Al_{0.5}Ga_{0.5}N$ layer corresponds to the AlGaN intermediate layer 53. The sample with the $Al_{0.5}Ga_{0.5}N$ layer having a thickness of 0 nm is a sample as a reference example of the nitride semiconductor device according to the embodiment.

Next, on the $Al_{0.5}Ga_{0.5}N$ layer, a GaN layer having a thickness of 260 nm was formed at 1130° C. Next, with the stacked body of the AlN layer, the $Al_{0.5}Ga_{0.5}N$ layer, and the GaN layer treated as one period, two additional periods of stacked bodies were formed. That is, the number of periods of stacked bodies in each of the four samples fabricated by the inventors is 3.

As shown in FIG. 5, the density of screw dislocations SC gradually decreases as the thickness $T_{AlGaN}$ of the AlGaN layer becomes thicker from 0 nm. Then, the density of screw dislocations SC increases if the thickness $T_{AlGaN}$ of the AlGaN layer becomes thicker than approximately 20 nm. The density of edge dislocations ED decreases as the thickness $T_{AlGaN}$ of the AlGaN layer becomes thicker from 0 nm. Then, the density of edge dislocations ED increases if the thickness $T_{AlGaN}$ of the AlGaN layer becomes thicker than approximately 20 nm.

Thus, it has turned out that the density of screw dislocations SC and the density of edge dislocations ED are correlated with the thickness $T_{AlGaN}$ of the AlGaN layer. Accordingly, it has turned out that by appropriately setting the thickness of the AlGaN intermediate layer 53, the AlGaN intermediate layer 53 has the effect of reducing screw dislocations SC and edge dislocations ED. Furthermore, it has turned out that in the case where the thickness of the AlGaN intermediate layer 53 is approximately 20 nm, the effects of screw dislocation SC reduction and edge dislocation ED reduction are easily achieved.

FIG. 6A to FIG. 6D are Nomarski microscope images illustrating examples of the surface of the GaN intermediate layer.

Figure 6A:
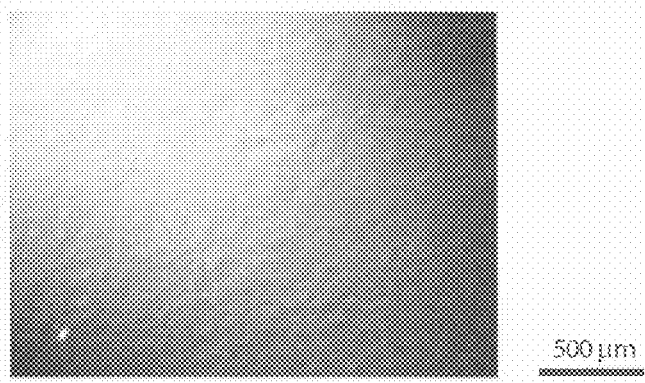
FIG. 6A to FIG. 6D are Nomarski microscope images illustrating examples of the surface of the GaN intermediate layer.
Figure 6B:
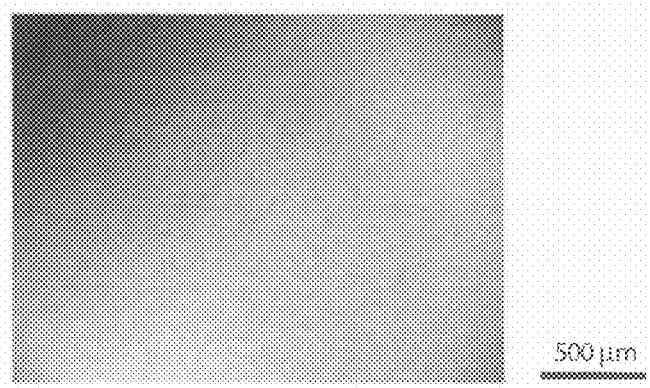
Figure 6C:
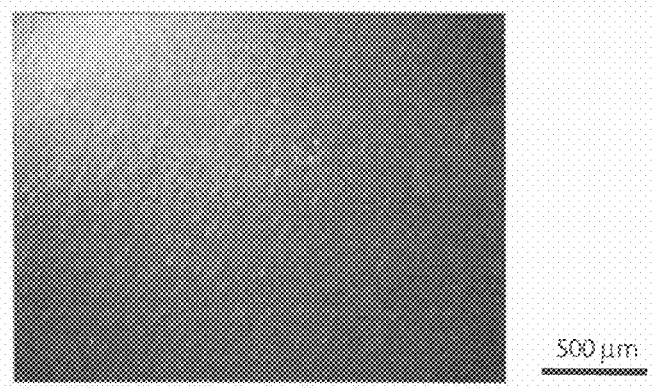
Figure 6D:
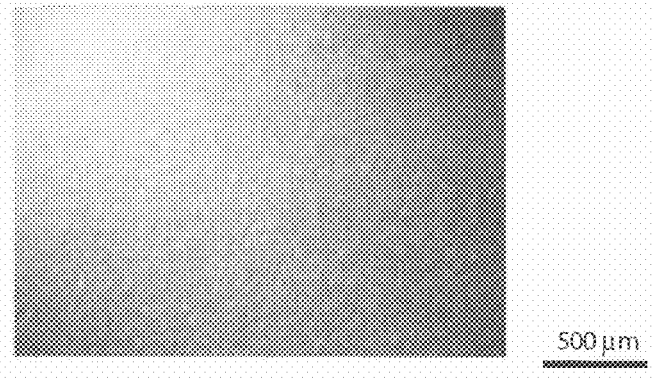

FIG. 6A is a Nomarski microscope image illustrating an example of the surface of the GaN intermediate layer 51 of the sample with the $Al_{0.5}Ga_{0.5}N$ layer having a thickness of 0 nm described above with reference to FIG. 5. FIG. 6B is a Nomarski microscope image illustrating an example of the surface of the GaN intermediate layer 51 of the sample with the $Al_{0.5}Ga_{0.5}N$ layer having a thickness of 13 nm described above with reference to FIG. 5. FIG. 6C is a Nomarski microscope image illustrating an example of the surface of the GaN intermediate layer 51 of the sample with the $Al_{0.5}Ga_{0.5}N$ layer having a thickness of 20 nm described above with reference to FIG. 5. FIG. 6D is a Nomarski microscope image illustrating an example of the surface of the GaN intermediate layer 51 of the sample with the $Al_{0.5}Ga_{0.5}N$ layer having a thickness of 33 nm described above with reference to FIG. 5.

As shown in FIG. 6A, on the surface of the GaN intermediate layer 51 of the sample with the $Al_{0.5}Ga_{0.5}N$ layer having a thickness of 0 nm, an isotropic morphology with a size of approximately several ten μm is formed. In contrast, as shown in FIG. 6B to FIG. 6D, on the surface of the GaN intermediate layer 51 of the samples with the $Al_{0.5}Ga_{0.5}N$ layer having a thickness of 13 nm, 20 nm, and 33 nm, respectively, an anisotropic morphology is formed. Thus, it has turned out that the AlGaN intermediate layer 53 has the effect of reducing dislocations by forming a morphology having an anisotropic pattern. Furthermore, from the Nomarski microscope images shown in FIG. 6B to FIG. 6D, it has turned out that the AlGaN intermediate layer 53 has the effect of suppressing the generation of cracks.

Figure 7A:
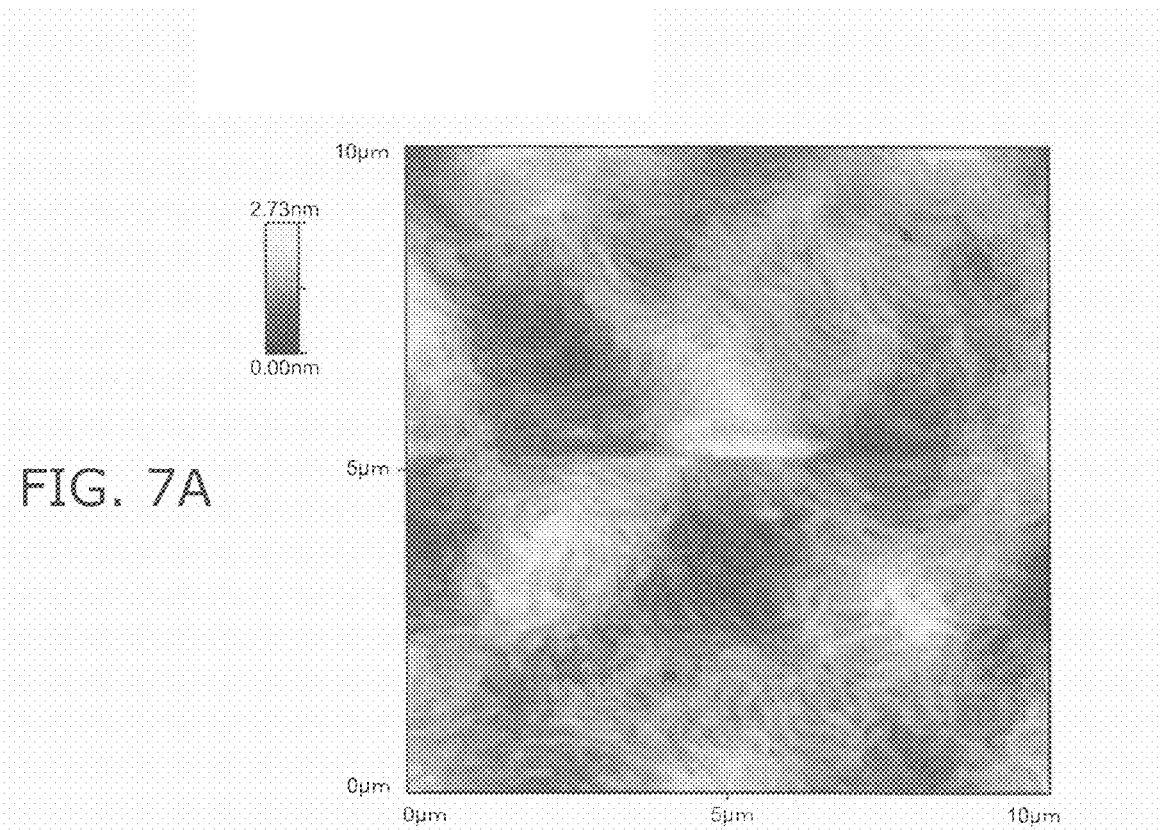
FIG. 7A and FIG. 7B are atomic force microscope images illustrating examples of the surface of the GaN intermediate layer.
Figure 7B:
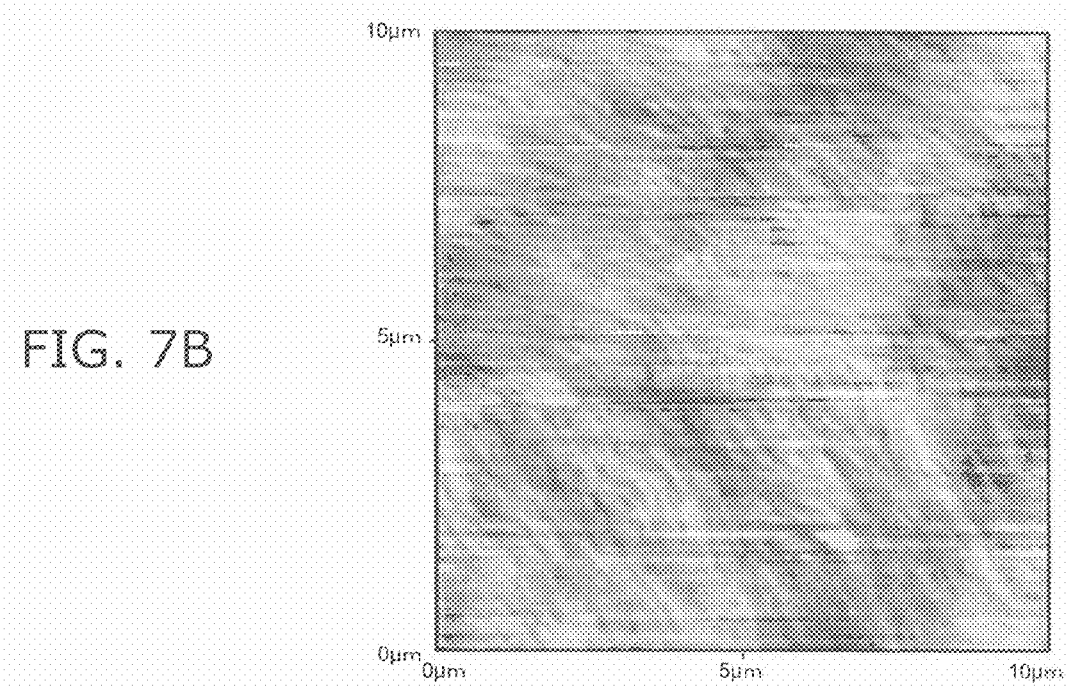

FIG. 7A and FIG. 7B are atomic force microscope images illustrating examples of the surface of the GaN intermediate layer.

FIG. 7A is an image measured by atomic force microscopy of the uppermost surface of the sample shown in FIG. 6A.

FIG. 7B is an image measured by atomic force microscopy of the uppermost surface of the sample shown in FIG. 6C.

As shown in FIG. 7A, on the surface of the GaN intermediate layer 51 of the sample with the $Al_{0.5}Ga_{0.5}N$ layer having a thickness of 0 nm, an isotropic morphology is formed. The difference between the maximum and minimum of the height of the formed morphology is approximately 2-3 nm. In contrast, as shown in FIG. 7B, on the surface of the GaN intermediate layer 51 of the sample with the $Al_{0.5}Ga_{0.5}N$ layer having a thickness of 20 nm, an anisotropic morphology is formed. According to the investigation result of the inventors, it has turned out that such an anisotropic morphology has low density of edge dislocations ED and also remains after removing the silicon substrate 40.

Figure 8:
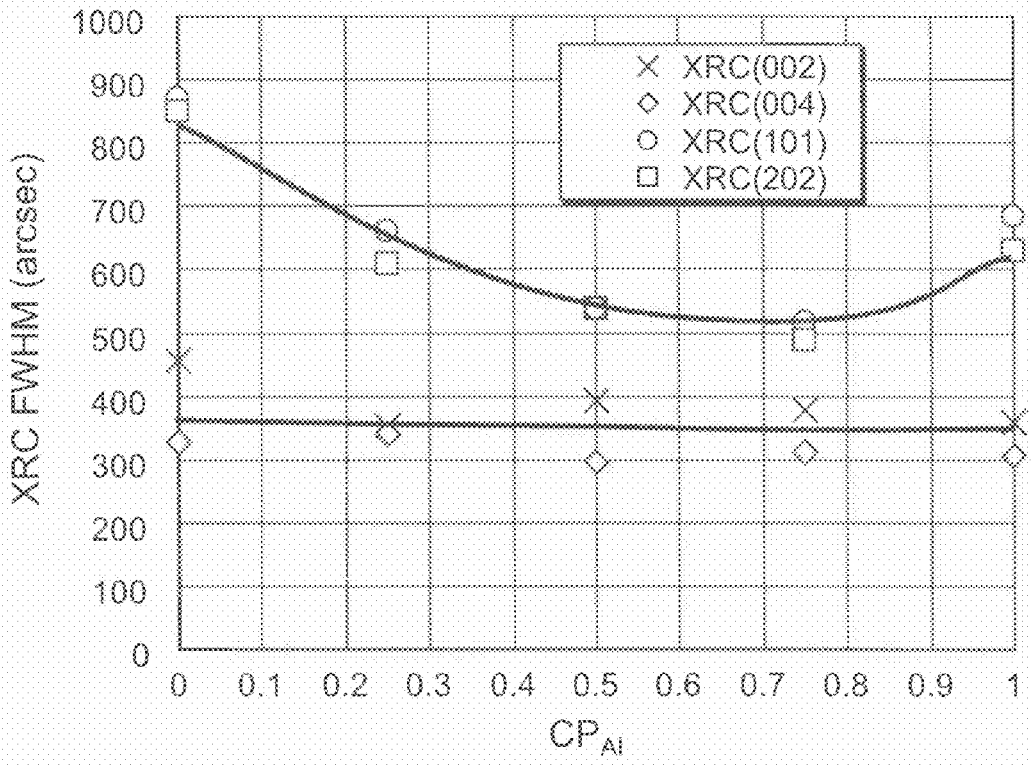
FIG. 8 is a graph illustrating an example relationship between the Al composition ratio $CP_{Al}$ and the full width at half maximum of the X-ray rocking curve XRC measurement.

FIG. 8 is a graph illustrating an example relationship between the Al composition ratio $CP_{Al}$ and the full width at half maximum of the X-ray rocking curve XRC measurement.

Figure 9:
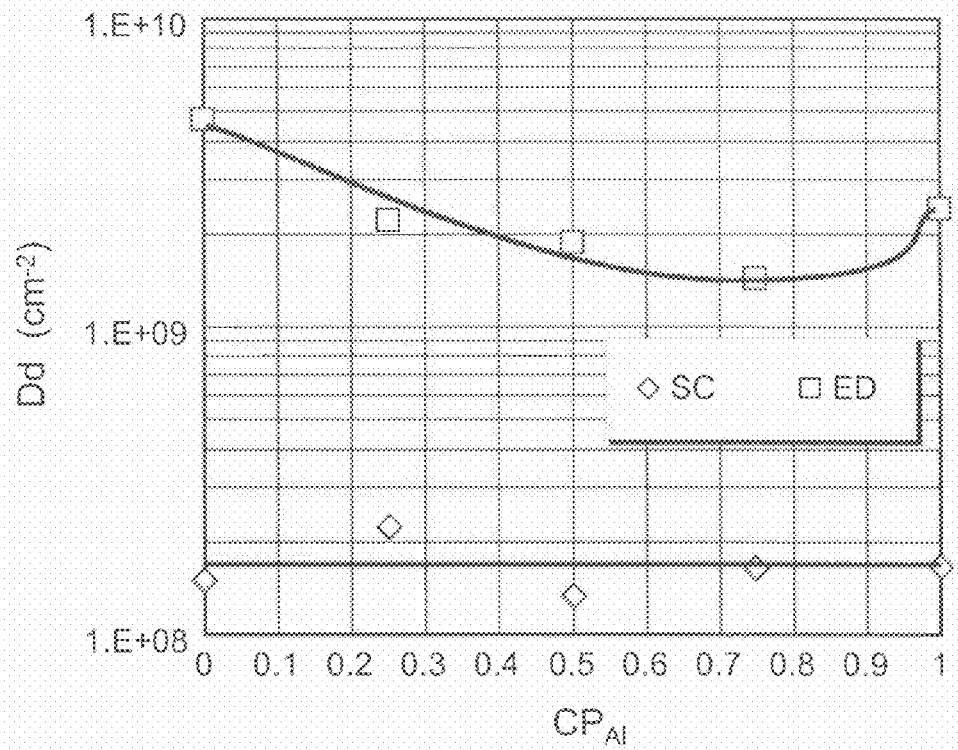
FIG. 9 is a graph illustrating an example relationship between the Al composition ratio $CP_{Al}$ and the dislocation density Dd.

FIG. 9 is a graph illustrating an example relationship between the Al composition ratio $CP_{Al}$ and the dislocation density Dd.

The inventors fabricated the following samples.

On a GaN layer as the GaN foundation layer 61, an AlN layer having a thickness of 12 nm was formed at 800° C. This AlN layer corresponds to the AlN intermediate layer 52.

Next, on the AlN layer, an $Al_xGa_{1-x}N$ layer having a thickness of 13 nm was formed at 1130° C. Here, the Al composition ratio $CP_{Al}$ was set to 0, 0.25, 0.5, and 0.75. That is, the inventors fabricated four samples with different Al composition ratios $CP_{Al}$ in the AlGaN intermediate layer 53, and investigated the difference of the effect based on the difference of the Al composition ratio $CP_{Al}$. The $Al_xGa_{1-x}N$ layer corresponds to the AlGaN intermediate layer 53. The sample with the Al composition ratio $CP_{Al}$ in the $Al_xGa_{1-x}N$ layer being 0 is a sample as a reference example of the nitride semiconductor device according to the embodiment.

Next, on the $Al_xGa_{1-x}N$ layer, a GaN layer having a thickness of 260 nm was formed at 1130° C. Next, with the stacked body of the AlN layer, the $Al_xGa_{1-x}N$ layer, and the GaN layer treated as one period, two additional periods of stacked bodies were formed. That is, the number of periods of stacked bodies in each of the four samples fabricated by the inventors is 3.

As shown in FIG. 8, the full width at half maximum of the X-ray rocking curve of the (002) plane and the full width at half maximum of the X-ray rocking curve of the (004) plane remain almost unchanged even if the Al composition ratio $CP_{Al}$ in the $Al_xGa_{1-x}N$ layer is varied. These planes are symmetric planes. In the following description, the "full width at half maximum of the X-ray rocking curve" is simply referred to as "X-ray half-width". On the other hand, the X-ray half-width of the (101) plane and the X-ray half-width of the (202) plane decrease as the Al composition ratio $CP_{Al}$ in the $Al_xGa_{1-x}N$ layer is increased from 0, and increase if the Al composition ratio $CP_{Al}$ in the $Al_xGa_{1-x}N$ layer is made larger than 0.75. These planes are asymmetric planes.

Thus, it has turned out that the correlation of the X-ray half-width of the (101) plane and the X-ray half-width of the (202) plane with the Al composition ratio $CP_{Al}$ in the $Al_xGa_{1-x}N$ layer is stronger than the correlation of the X-ray half-width of the (002) plane and the X-ray half-width of the (004) plane with the Al composition ratio $CP_{Al}$ in the $Al_xGa_{1-x}N$ layer. In other words, it has turned out that the correlation of the X-ray half-width of the (002) plane and the X-ray half-width of the (004) plane with the Al composition ratio $CP_{Al}$ in the $Al_xGa_{1-x}N$ layer is weaker than the correlation of the X-ray half-width of the (101) plane and the X-ray half-width of the (202) plane with the Al composition ratio $CP_{Al}$ in the $Al_xGa_{1-x}N$ layer.

As shown in FIG. 9, the density of screw dislocations SC remains almost unchanged even if the Al composition ratio $CP_{Al}$ in the $Al_xGa_{1-x}N$ layer is varied. The density of screw dislocations SC is derived from the X-ray half-width of the (002) plane and the X-ray half-width of the (004) plane. On the other hand, the density of edge dislocations ED decreases as the Al composition ratio $CP_{Al}$ in the $Al_xGa_{1-x}N$ layer is increased from 0, and increases if the Al composition ratio $CP_{Al}$ in the $Al_xGa_{1-x}N$ layer is made larger than 0.75. The density of edge dislocations ED is derived from the X-ray half-width of the (101) plane and the X-ray half-width of the (202) plane.

Thus, it has turned out that the correlation between the density of edge dislocations ED and the Al composition ratio $CP_{Al}$ in the $Al_xGa_{1-x}N$ layer is stronger than the correlation between the density of screw dislocations SC and the Al composition ratio $CP_{Al}$ in the $Al_xGa_{1-x}N$ layer. In other words, it has turned out that the correlation between the density of screw dislocations SC and the Al composition ratio $CP_{Al}$ in the $Al_xGa_{1-x}N$ layer is weaker than the correlation between the density of edge dislocations ED and the Al composition ratio $CP_{Al}$ in the $Al_xGa_{1-x}N$ layer. As shown in FIG. 9, the density of edge dislocations ED is approximately ten times the density of screw dislocations SC. Thus, the number of edge dislocations ED significantly contributes to the total number of dislocations. Hence, the effect of reducing edge dislocations ED significantly contributes to the effect of improving the crystal quality.

Thus, it has turned out that the density of edge dislocations ED has a stronger correlation with the Al composition ratio $CP_{Al}$ in the $Al_xGa_{1-x}N$ layer. Accordingly, it has turned out that by appropriately setting the Al composition ratio in the AlGaN intermediate layer 53, the AlGaN intermediate layer 53 has the effect of edge dislocations ED reduction. That is, by appropriately setting the Al composition ratio in the AlGaN intermediate layer 53, the crystal quality is improved. Furthermore, in the case of providing the AlGaN intermediate layer 53, compared with the case of not providing the AlGaN intermediate layer 53, the effect of edge dislocations ED reduction is achieved for any $CP_{Al}$. However, it has turned out that in the case where the Al composition ratio $CP_{Al}$ in the AlGaN intermediate layer 53 is 0.75, the effect of edge dislocations ED reduction is easily achieved.

FIG. 10A to FIG. 10D are Nomarski microscope images illustrating examples of the surface of the GaN intermediate layer.

Figure 10A:
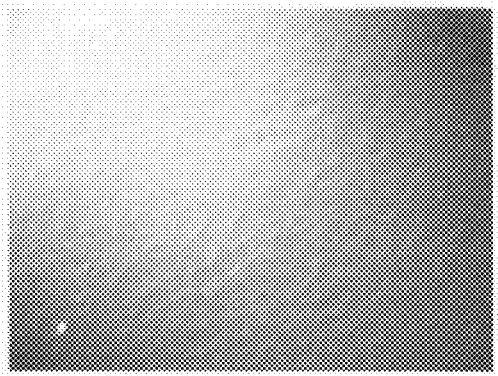
FIG. 10A to FIG. 10D are Nomarski microscope images illustrating examples of the surface of the GaN intermediate layer.

FIG. 10A is a Nomarski microscope image illustrating an example of the surface of the GaN intermediate layer 51 in the case where the Al composition ratio $CP_{Al}$ in the AlGaN intermediate layer 53 is 0. That is, FIG. 10A is a Nomarski microscope image illustrating a reference example of the nitride semiconductor device according to the embodiment.

Figure 10B:
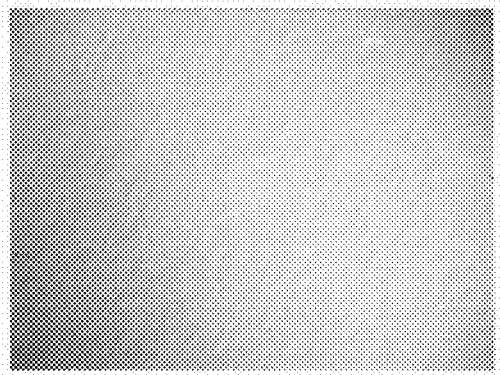
Figure 10C:
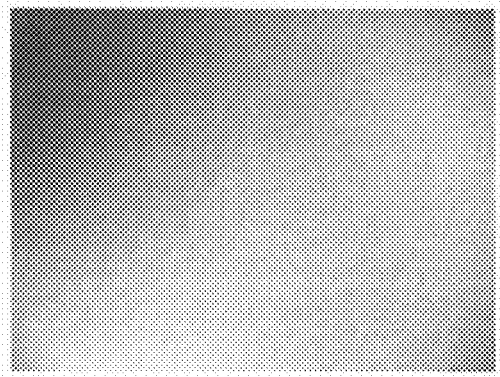
Figure 10D:
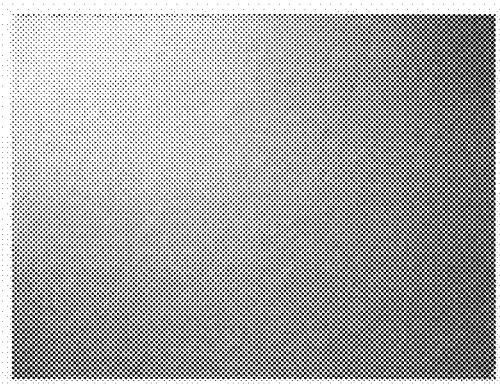

FIG. 10B is a Nomarski microscope image illustrating an example of the surface of the GaN intermediate layer 51 in the case where the Al composition ratio $CP_{Al}$ in the AlGaN intermediate layer 53 is 0.25. FIG. 10C is a Nomarski microscope image illustrating an example of the surface of the GaN intermediate layer 51 in the case where the Al composition ratio $CP_{Al}$ in the AlGaN intermediate layer 53 is 0.5. FIG. 10D is a Nomarski microscope image illustrating an example of the surface of the GaN intermediate layer 51 in the case where the Al composition ratio $CP_{Al}$ in the AlGaN intermediate layer 53 is 0.75.

As shown in FIG. 10A, on the surface of the GaN intermediate layer 51 of the sample having an Al composition ratio $CP_{Al}$ of 0, an isotropic morphology with a size of approximately several ten micrometers (μm) is formed. In contrast, as shown in FIG. 10B to FIG. 10D, on the samples having an Al composition ratio $CP_{Al}$ of 0.25, 0.5, and 0.75, respectively, an anisotropic morphology is formed. It has turned out that the anisotropy is varied with the Al composition ratio $CP_{Al}$. Thus, it has turned out that the AlGaN intermediate layer 53 has the effect of dislocation reduction by forming a surface having anisotropy.

Figure 11:
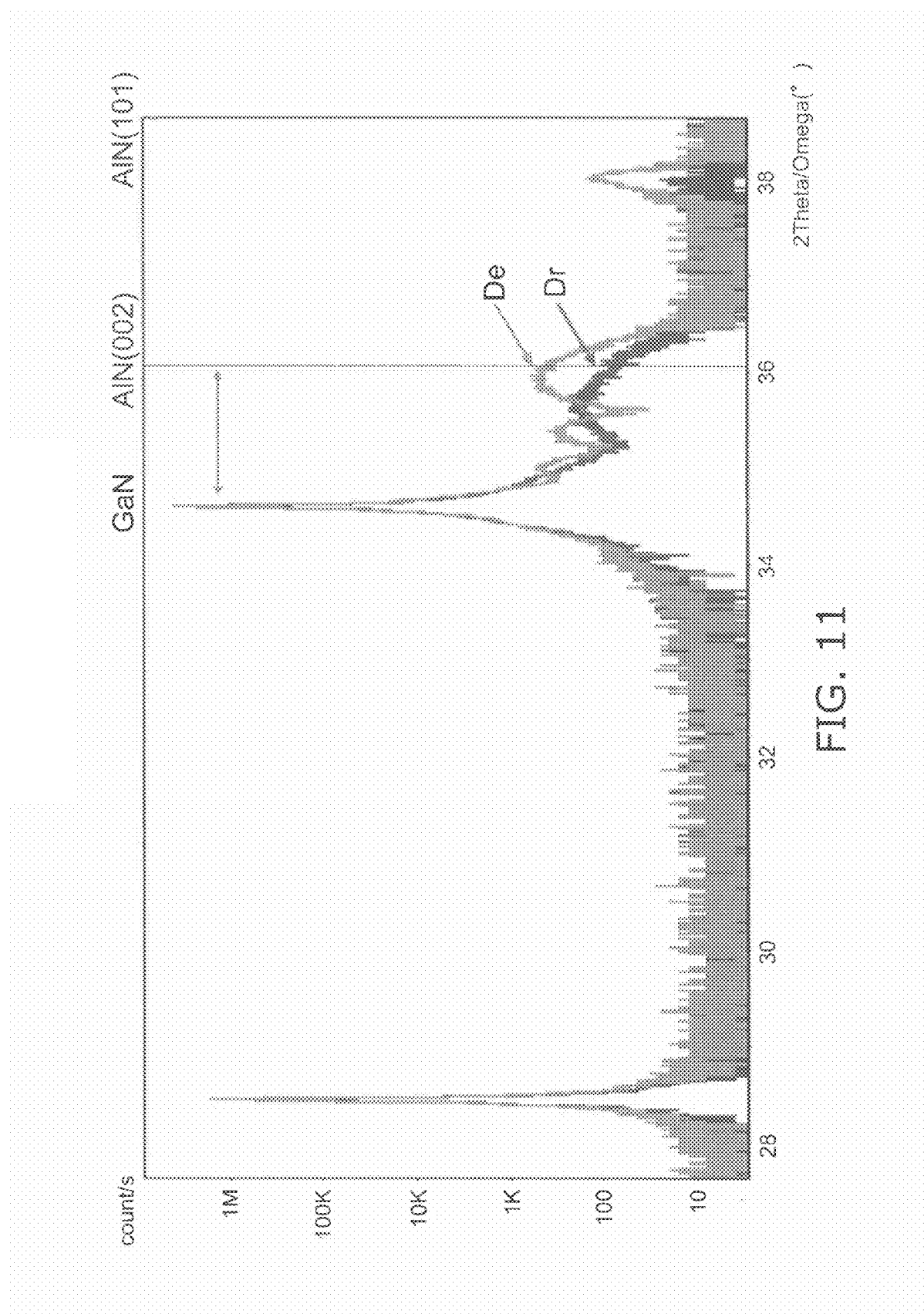
FIG. 11 is a graph illustrating an example result of crystal structure analysis by X-ray diffraction.

FIG. 11 is a graph illustrating an example result of crystal structure analysis by X-ray diffraction.

The graph shown in FIG. 11 shows data De according to the embodiment with the AlN intermediate layer 52 formed at 800° C., and data Dr according to the reference example with the AlN intermediate layer 52 formed at a temperature higher than 1000° C.

As shown in FIG. 11, a peak of GaN has appeared in the data De according to the embodiment and the data Dr according to the reference example.

In the data Dr according to the reference example, a peak has appeared between GaN and AlN(002). The reason for this is considered as follows. The AlN intermediate layer 52 is formed at a temperature higher than 1000° C., and hence is less likely to undergo lattice relaxation. More specifically, because the AlN intermediate layer 52 is less likely to undergo lattice relaxation, part of the AlN intermediate layer 52 formed on the GaN foundation layer 61 is coherently grown with the lattice constant of the GaN foundation layer 61. Furthermore, even if the AlN intermediate layer 52 is grown to a prescribed thickness, the lattice constant of the AlN intermediate layer 52 does not return to the lattice constant of relaxed AlN. Thus, it is considered that in the data Dr according to the reference example, a peak has appeared between relaxed GaN and AlN(002).

In contrast, in the data De according to the embodiment, a peak of AlN(002) has appeared at a diffraction angle corresponding to relaxed AlN(002). The reason for this is considered as follows. The AlN intermediate layer 52 is formed at 800° C., and hence is likely to undergo lattice relaxation. More specifically, because the AlN intermediate layer 52 is likely to undergo lattice relaxation, the lattice constant of the AlN intermediate layer 52 can return to the lattice constant of AlN free from strain. Thus, it is considered that in the data De according to the embodiment, a peak of AlN(002) has appeared.

Furthermore, in the data De according to the embodiment, a peak of AlN(101) has appeared. As a result of the investigation by the inventors, it has turned out that in the case of forming the AlN intermediate layer 52 at a temperature lower than 1000° C., the peak of AlN(101) is likely to appear. Thus, if the peak of AlN(101) has appeared, it can be considered that the AlN intermediate layer 52 has been formed at a temperature lower than 1000° C.

Figure 12A:
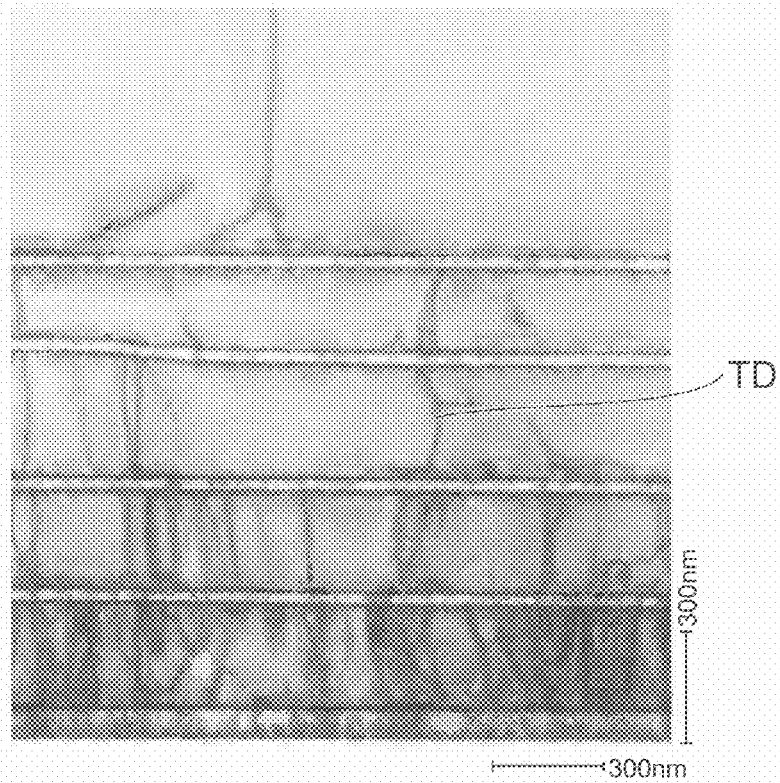
FIG. 12A and FIG. 12B are transmission electron microscope images illustrating examples of the stacked intermediate layer according to the embodiment.
Figure 12B:
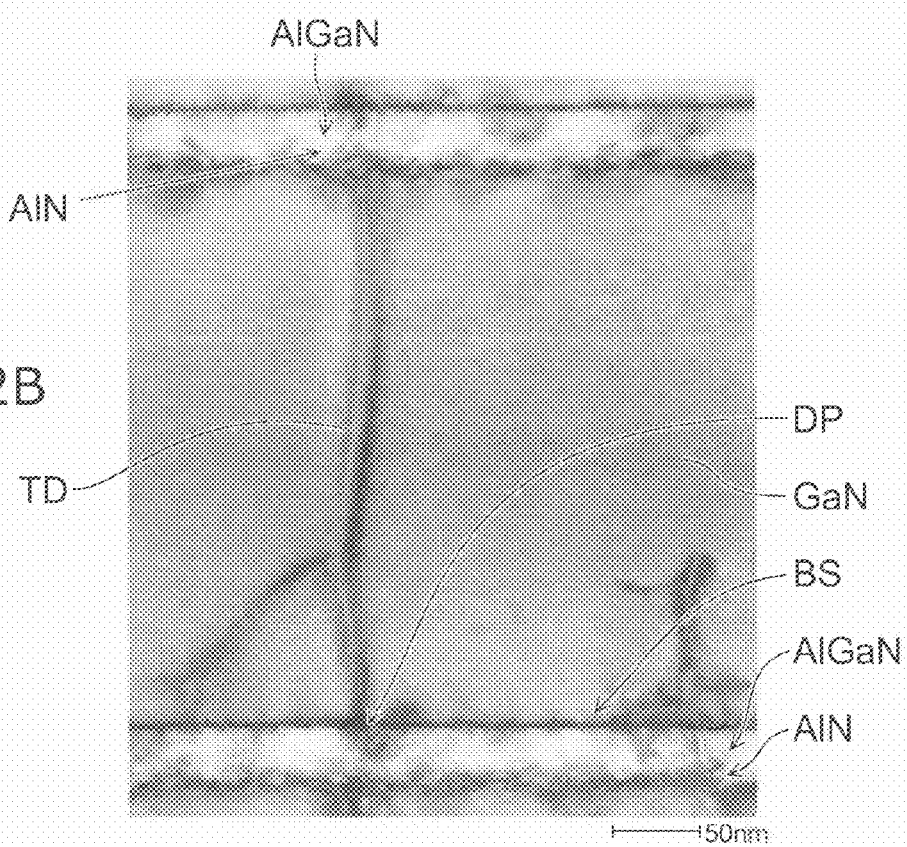

FIG. 12A and FIG. 12B are transmission electron microscope images illustrating examples of the stacked intermediate layer according to the embodiment.

Figure 13A:
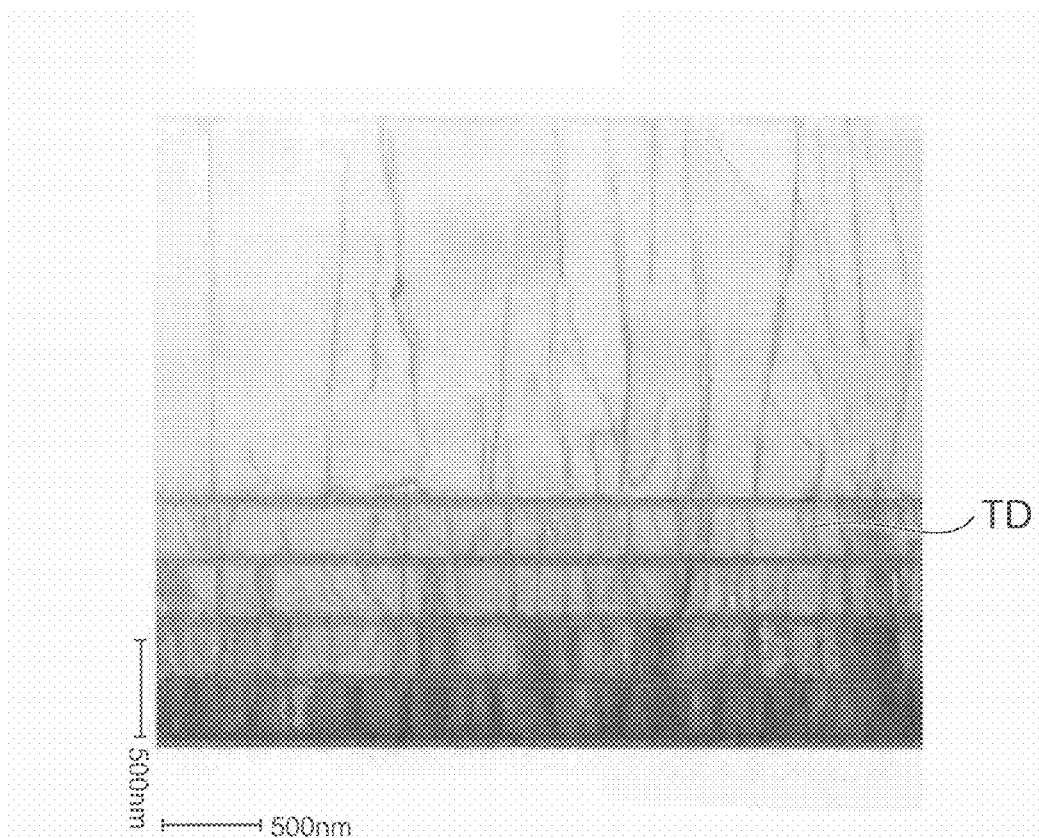
FIG. 13A and FIG. 13B are transmission electron microscope images illustrating examples of the stacked intermediate layer according to the reference example.
Figure 13B:
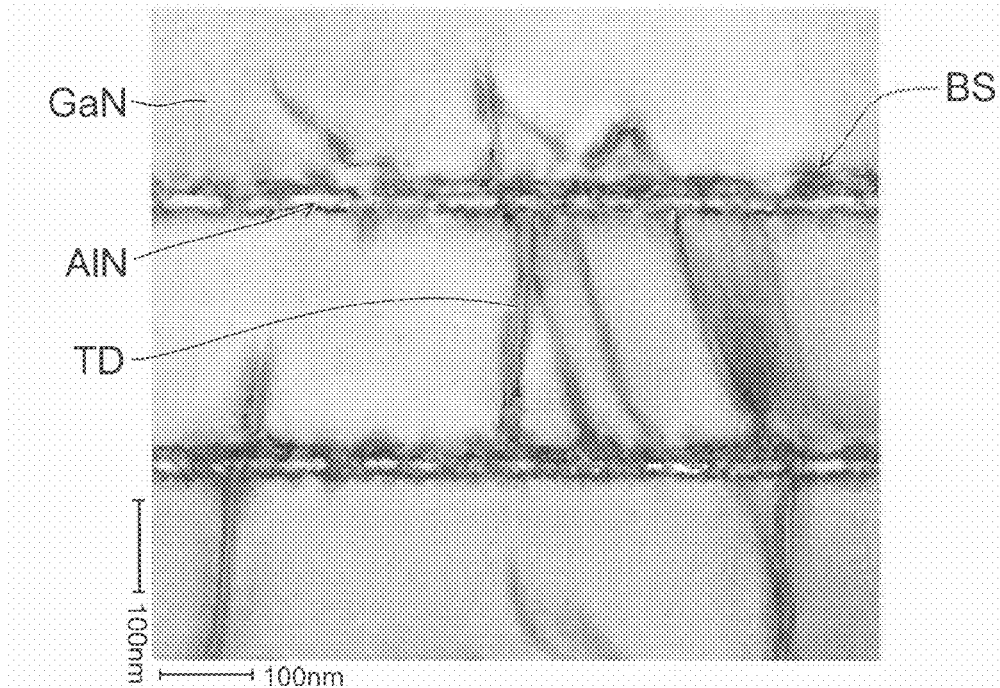

FIG. 13A and FIG. 13B are transmission electron microscope images illustrating examples of the stacked intermediate layer according to the reference example.

FIG. 12B and FIG. 13B are magnified images of the transmission electron microscope image shown in FIG. 12A and FIG. 13A.

As shown in FIG. 13B, the stacked intermediate layer 50 according to the reference example does not include the AlGaN intermediate layer. In contrast, as shown in FIG. 12B, the stacked intermediate layer 50 according to the embodiment includes the AlGaN intermediate layer. It has turned out that the number of threading dislocations TD generated in the stacked intermediate layer 50 according to the embodiment is smaller than the number of threading dislocations TD generated in the stacked intermediate layer 50 according to the reference example. Thus, it has turned out that the AlGaN layer (AlGaN intermediate layer 53) provided in the stacked intermediate layer 50 has the effect of suppressing the generation of threading dislocations TD. That is, it has turned out that the effect of significantly reducing threading dislocations TD is achieved by the periodic structure including the AlN intermediate layer, the AlGaN intermediate layer, and the GaN intermediate layer with a suitable period.

The inventors fabricated the following samples. In the structure according to the embodiment, an $NH_3$ flow rate in forming the AlGaN intermediate layer was changed from 6 slm to 1.2 slm and the AlGaN intermediate layer was formed. A composition ratio $CP_{Al}$ of Al in the AlGAN intermediate layer formed at this time was 0.8, and a film thickness was 20 nm. A film thickness of the GaN intermediate layer on the AlGaN intermediate layer 53 was changed from 300 nm to 450 nm. As for the rest, the same structure as the stacked intermediate layer 50 was used.

The X-ray rocking curve was measured on this example. Then, the X-ray half-width of the (002) plane was 449 arcseconds, the X-ray half-width of the (004) plane was 438 arcseconds, the X-ray half-width of the (101) plane was 481 arcseconds, and the X-ray half-width of the (202) plane was 407 arcseconds. Dislocation density is developed from this result. The density of the spiral dislocation SC was $3.76 \times 10^8$ $cm^{-2}$, and the density of the edge dislocation ED was $6.94 \times 10^8 \, cm^{-2}$. Thus, the density of the edge dislocation ED having degradation effect on the emission characteristics could be reduced.

The inventors performed experiments and its analysis in order to investigate the effect having the edge dislocation reduced. The inventors investigated correlation between the result from cross-sectional image of the transmission electron microscope image (hereinafter, referred to as "cross-sectional TEM image") and the dislocation density. As a result, it has turned out that the interface between the AlGaN intermediate layer and the GaN intermediate layer observed by the cross-sectional TEM image is flat with decreasing density of the edge dislocation in the sample.

For example, in the cross-sectional TEM image of the reference example shown in FIG. 13B, a height of the AlN intermediate layer has a height difference of 12 nm being approximately same as the thickness of the AlN intermediate layer at the interface BS between the AlN intermediate layer and the GaN intermediate layer. That is, the AlN layer is not flat at the interface BS between the AlN intermediate layer and the GaN intermediate layer. The dislocation extends laterally on the GaN intermediate layer side on the AlN intermediate layer and tends to disappear in a range of height 15 nm on the AlN intermediate layer. On the other hand, in the cross-sectional TEM image of the experimental example shown in FIG. 12B, the AlGaN intermediate layer is flat at the interface between the AlGaN intermediate layer and the GaN intermediate layer. The dislocation extends laterally on the GaN intermediate layer side on the AlGaN intermediate layer and tends to disappear in a range of height 5 nm on the AlGaN intermediate layer. The flatness of the surface of the AlGaN intermediate layer in the experimental example is better than the flatness of the AlN intermediate layer in the reference example. The threading dislocation TD in the experimental example disappears in a narrower film thickness range compared with the reference example. As a result, it has turned out that the density of the edge dislocation ED is small.

Also in FIG. 12B, propagation appearance of the threading dislocation from a recess DP of the AlN intermediate layer and the AlGaN intermediate layer can be observed. It can be considered that the recess of the AlN intermediate layer and the AlGaN intermediate layer is due to the propagation of the threading dislocation TD or the threading dislocation TD is newly produced. From this result, it is considered that the process of flattening the surface by the AlGaN intermediate layer has the effect of the threading dislocation TD reduction.

Figure 14A:
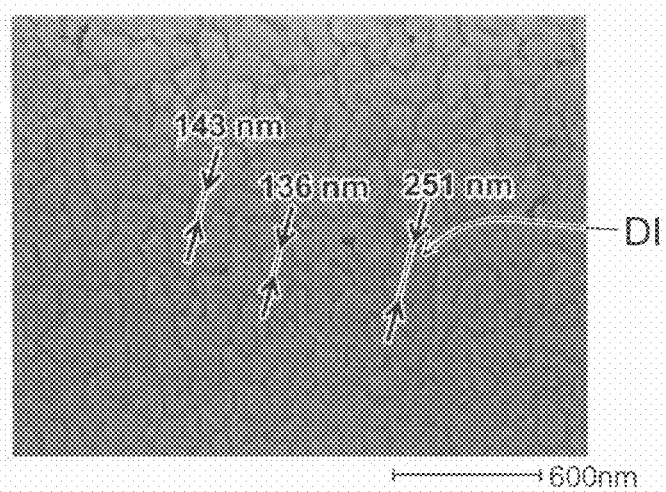
FIG. 14A to FIG. 14C are scanning electron microscope images illustrating examples of surfaces of the samples.
Figure 14B:
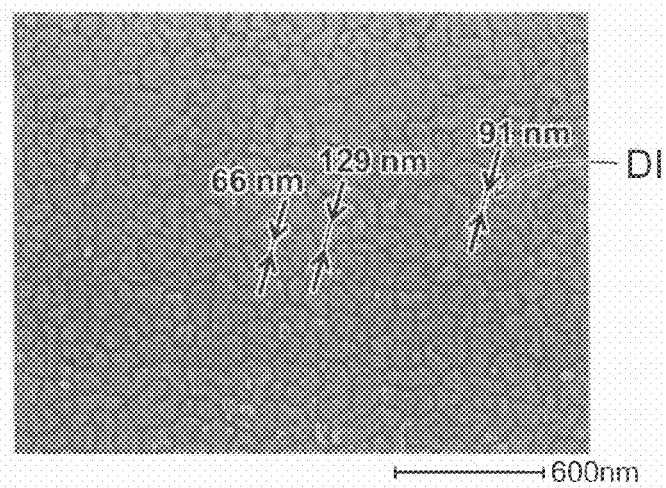
Figure 14C:
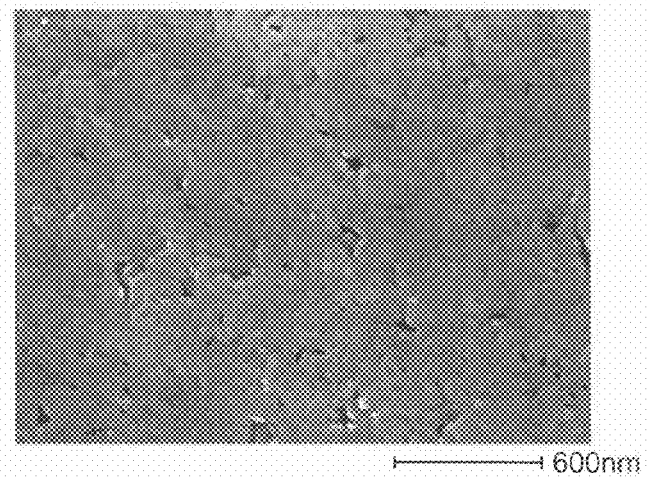

FIG. 14A to FIG. 14C are scanning electron microscope images illustrating examples of surfaces of the samples.

The inventors performed also the following experiment in order to investigate the relationship between the dislocation density and the flatness of the AlN intermediate layer and the Al GaN intermediate layer. First, the inventors fabricated the sample, in order to investigate the flatness of the AlN intermediate layer, such that a first periodic AlN intermediate layer is formed at 800° C., the temperature is increased to a growth start temperature of the GaN intermediate layer and the growth is ended as is. In this case, the image of the sample surface observed by the scanning electron microscope is like as shown in FIG. 14A. The AlGaN intermediate layer grows in being marked out into each domain by grooves (DI) on the GaN layer serving as the foundation layer. A domain diameter is approximately not more than about 100 nm and not less than 300 nm. Such a phenomenon forming domains is a generally observed phenomenon in a relaxation process of strain. When the surface of this sample is measured by the atomic force microscope, RMS value of the surface height was 1.43 nm. The case where the GaN intermediate layer is provided on the AlN intermediate layer having this surface configuration corresponds to the reference example, and the density of the edge dislocation is large to be $4.72 \times 10^9 \, cm^{-2}$.

Next, in the aforementioned experiment in which the AlN intermediate layer was observed, a sample was fabricated under the same layer structure other than the AlN intermediate layer and the same fabrication condition, and at a growth temperature of the AlN intermediate layer changed (set) to 1000° C. Similarly, the surface was observed by the scanning electron microscope. The results (image) is like as shown in FIG. 14B. Compared with the sample shown in FIG. 14A, each domain size of the AlN intermediate layer is smaller. The domain diameter is approximately not less than about 50 nm and not more than 150 nm. When the surface of this sample was observed by the atomic force microscope, a RMS value of the surface height is 1.71 nm and larger than a RMS value of the surface height of the sample shown in FIG. 14A. The density of the edge dislocation ED of the sample in which the GaN intermediate layer is provided on the AlN intermediate layer having this surface configuration to from the same structure as the reference example is $1.85 \times 10^{10} \, cm^{-2}$ to be extremely large. That is, the dislocation density is higher with decreasing domain size, in other word, increasing groove DI at the domain boundary.

Next, similar to the experimental example, a sample having the AlGaN intermediate layer with a thickness of 20 nm formed on the AlN intermediate layer was fabricated. The image of the surface of the AlGaN intermediate layer observed by the scanning electron microscope is like as shown in FIG. 14C. It turn out that domains are not formed on the surface and a flat surface is obtained. A RMS value of the surface height measured by the atomic force microscope is 0.62 nm and the sample surface is flattest among the samples shown in FIG. 14A to FIG. 14C. The density of the edge dislocation ED in the sample obtained by further providing the GaN intermediate layer on the flat surface and periodically repeating is $6.94 \times 10^8$ cm$^{-2}$ as described previously. This density of the edge dislocation is smallest among the density of the edge dislocation of the examples shown in FIG. 14A to FIG. 14C.

Thus, the density of the threading dislocation TD is reduced by forming the GaN layer on the flat AlGaN intermediate layer. The recess is formed on the surface by the AlN intermediate layer and next the AlGaN intermediate layer is provided, and thereby the flat surface can be obtained. For example, it becomes possible to bury the grooves DI at the domain boundary of maximum 12 nm produced by the AlN intermediate layer with the AlGaN intermediate layer having a thickness of relatively thin 20 nm. Thus, the AlGaN intermediate layer has the effect burying the grooves. In this way, the GaN intermediate layer grows on the AlGaN intermediate layer having a RMS value of surface height less than 1 nm, and thus the edge dislocation ED reduction effect is likely to be obtained.

Figure 15:
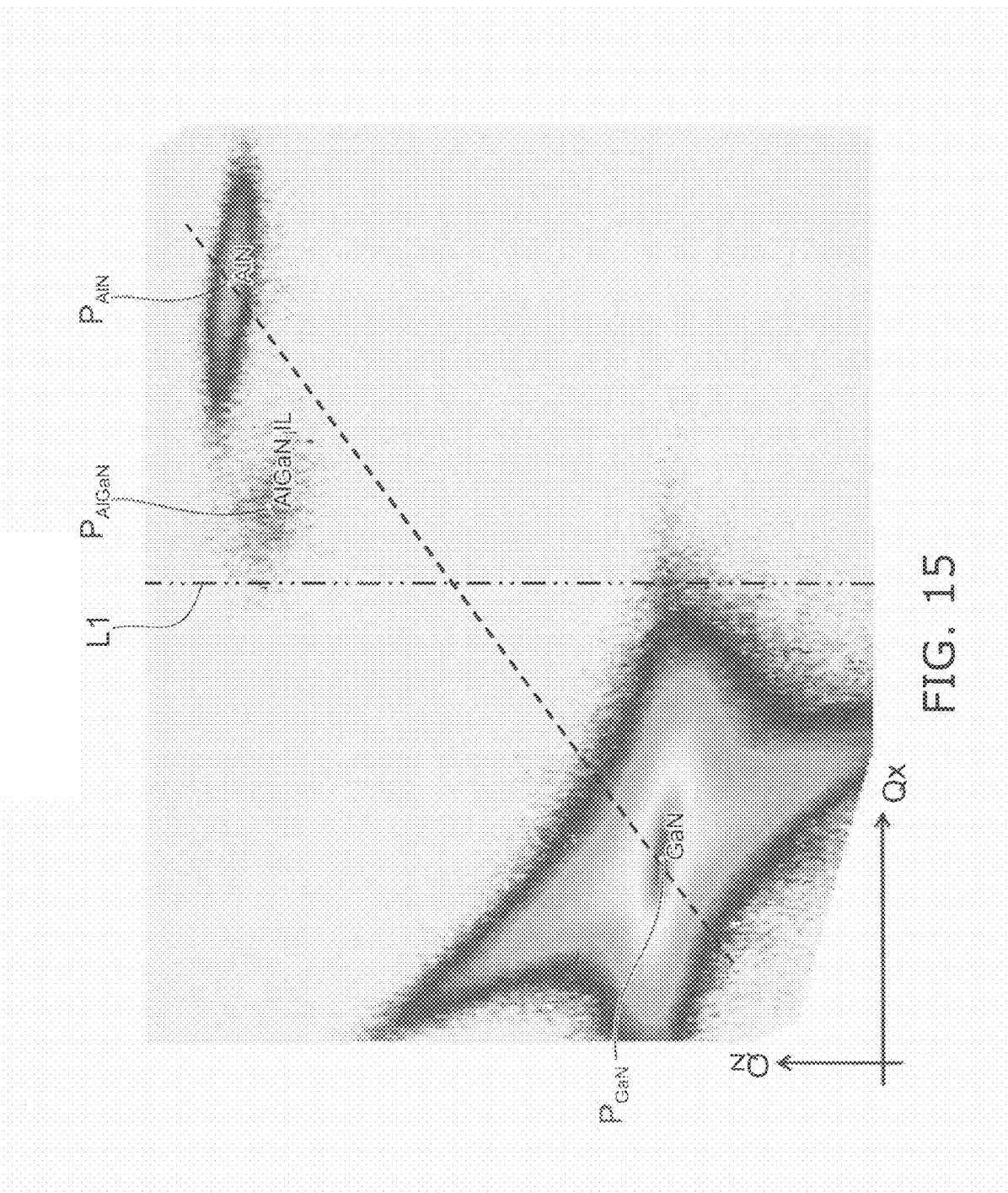
FIG. 15 shows an example of results of X-ray reciprocal space mapping measurement in the experimental example.

FIG. 15 shows an example of results of X-ray reciprocal space mapping measurement in the experimental example.

The horizontal axis Qx is a reciprocal number of lattice spacing in a <11-20> direction perpendicular to a growth direction. That is, the horizontal axis Qx can be considered to be a-axis lattice constant. The vertical axis Qz is a reciprocal number of lattice spacing in a <0004> direction parallel to the growth direction. That is, the vertical axis Qz can be considered to be c-axis lattice constant. The peak $P_{AlGaN}$ of the AlGaN intermediate layer exists on a right-upper side of the peak $P_{GaN}$ of the GaN intermediate layer. The c-axis length and the a-axis length in the peak $P_{AlGaN}$ of the AlGaN intermediate layer are smaller than the a-axis length and the c-axis length in the peak $P_{GaN}$ of the GaN intermediate layer, respectively. In the horizontal axis Qx, the peak $P_{AlGaN}$ of the AlGaN intermediate layer is closer to the peak $P_{AlN}$ of the AlN intermediate layer than the peak $P_{GaN}$ of the GaN intermediate layer. In other word, the absolute value of difference between the a-axis lattice constant of the AlGaN intermediate layer and the a-axis lattice constant of the GaN intermediate layer is larger than the absolute value of difference between the a-axis lattice constant of the AlGaN intermediate layer and the a-axis lattice constant of the AlN intermediate layer.

In this way, when the absolute value of difference between the a-axis lattice constant of the AlGaN intermediate layer and the a-axis lattice constant of the GaN intermediate layer is larger than the absolute value of difference between the a-axis lattice constant of the AlGaN intermediate layer and the a-axis lattice constant of the AlN intermediate layer, the effect suppressing the crack is large to be likely to be obtained. Here, the average a-axis lattice constant of the AlGaN-based intermediate layer is a weighted average value of respective a-axis lattice constants of the peak $P_{GaN}$ of the GaN intermediate layer and the peak $P_{AlGaN}$ of the AlGaN intermediate layer weighted by respective film thicknesses. The absolute value of difference between the a-axis lattice constant of the AlGaN-based intermediate layer and the a-axis lattice constant of the GaN intermediate layer is larger than the absolute value of difference between the a-axis lattice constant of the AlGaN-based intermediate layer and the a-axis lattice constant of the AlN intermediate layer. Thus, when the a-axis lattice constant of the AlGaN-based intermediate layer is closer to the a-axis lattice constant of the AlN than the a-axis lattice constant of GaN, the effect suppressing the crack is large to be likely to be obtained.

A straight line (chain double-dashed line) L1 shown in FIG. 15 represents an intermediate line between the peak $P_{GaN}$ of the GaN intermediate layer and the peak $P_{AlN}$ of the AlN intermediate layer as viewed in the direction of the horizontal axis Qx.

The GaN intermediate layer receives compressive strain because the GaN intermediate layer with a relatively large lattice constant is grown on the AlGaN intermediate layer. The compressive strain is provided in the growth layer, and thereby tensile strain produced in temperature decrease after crystal growth is finished, and the effect suppressing the crack can be associated. When the a-axis lattice constant of the AlGaN intermediate layer is closer to the a-axis lattice constant of the AlN than the a-axis lattice constant of GaN, the effect suppressing the crack is large to be likely to be obtained.

Thus, in order to obtain both effects of suppression of the crack and reduction of the dislocation density, it is preferred to prepare the AlGaN-based intermediate layer which has the a-axis lattice constant smaller than the GaN intermediate layer and has the flat surface. According to the embodiment, the structure like this can be formed.

Second Embodiment

The embodiment relates to a nitride semiconductor wafer. This wafer includes e.g. at least part of a semiconductor device, or a portion constituting at least part of a semiconductor device. This semiconductor device includes e.g. a semiconductor light emitting device, a semiconductor light receiving device, and an electronic device.

FIG. 16A to FIG. 16D are schematic views illustrating a nitride semiconductor wafer according to the second embodiment.

Figures 16A, 16B, 16C, 16D:
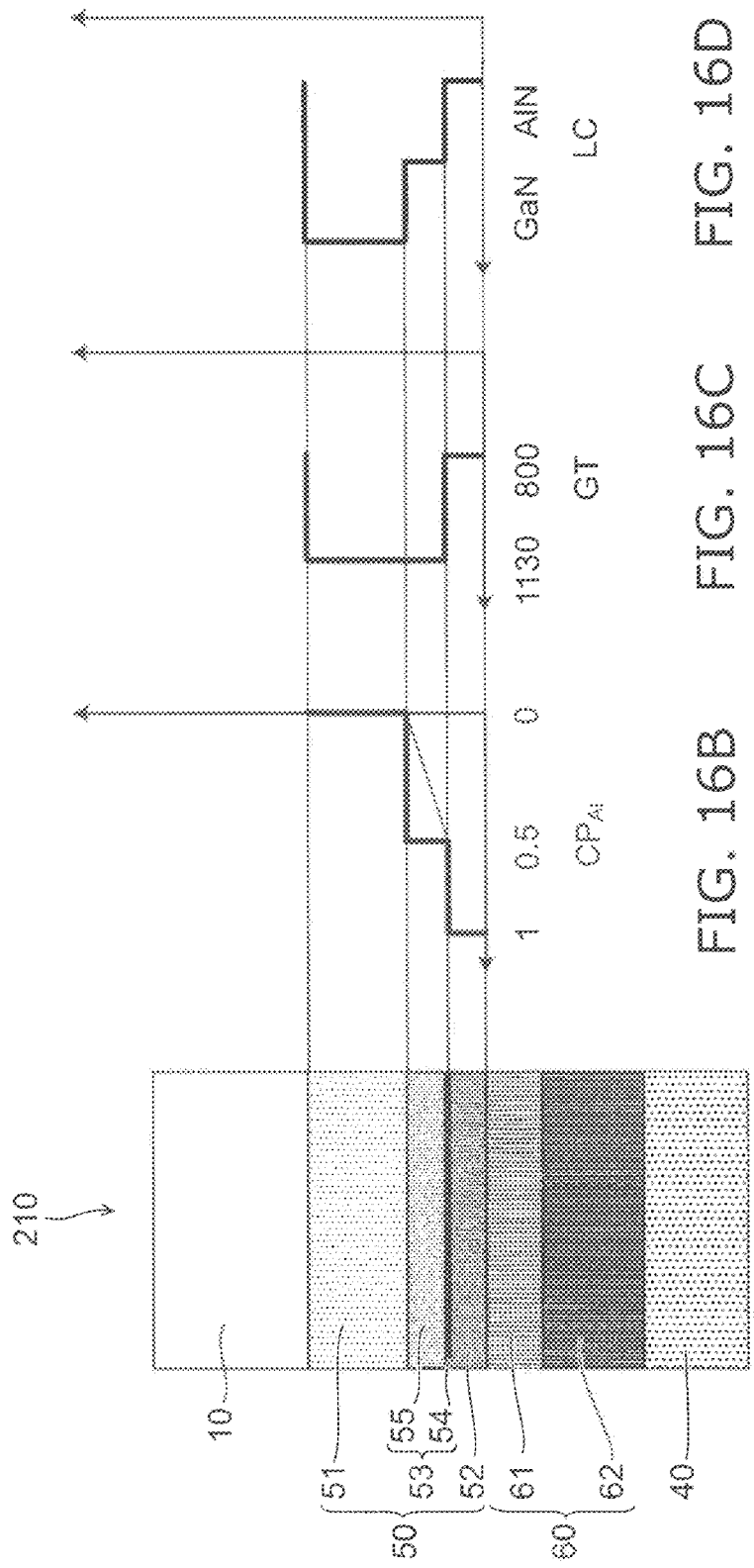
FIG. 16A to FIG. 16D are schematic views illustrating a nitride semiconductor wafer according to the second embodiment.

FIG. 16A is a schematic sectional view illustrating the configuration of the nitride semiconductor wafer according to the second embodiment. FIG. 16B is a graph illustrating the Al composition ratio ($CP_{Al}$) in the stacked intermediate layer. FIG. 16C is a graph illustrating the growth temperature GT in the stacked intermediate layer. FIG. 16D is a graph illustrating the a-axis lattice constant LC in the stacked intermediate layer.

As shown in FIG. 16A, the nitride semiconductor wafer 210 according to the embodiment includes a silicon substrate 40, a foundation layer 60, a stacked intermediate layer 50, and a functional layer 10. Each of the foundation layer 60 and the stacked intermediate layer 50 can be based on the configuration described with reference to the first embodiment.

More specifically, the foundation layer 60 includes an AlN buffer layer 62 and a GaN foundation layer 61. The foundation layer 60 may further include an AlGaN foundation layer 63.

The stacked intermediate layer 50 includes a GaN intermediate layer 51, an AlN intermediate layer 52, and an AlGaN intermediate layer 53. Alternatively, the stacked intermediate layer 50 may have a structure in which the AlN intermediate layer 52, the AlGaN intermediate layer 53, and the GaN intermediate layer 51 are periodically stacked a plurality of times in this order.

In the stacked intermediate layer 50 of the embodiment, the lattice constant parallel to the stacking direction varies along the stacking direction from the lattice constant of AlN not affected by strain to the lattice constant of GaN.

More specifically, the AlN intermediate layer 52 is formed on the GaN foundation layer 61. The thickness of the AlN intermediate layer 52 is e.g. approximately 12 nm. The crystal growth temperature of the AlN intermediate layer 52 is preferably e.g. 500° C. or more and 1050° C. or less. As shown in FIG. 16C, the formation temperature of the AlN intermediate layer 52 is e.g. 800° C. Hence, the AlN intermediate layer 52 easily undergoes lattice relaxation. Thus, from the initial phase of forming the AlN intermediate layer 52, the AlN intermediate layer 52 is less likely to undergo tensile strain from the GaN foundation layer 61 serving as a foundation. As a result, the AlN intermediate layer 52 can be formed so as to avoid the influence of strain from the GaN foundation layer 61 serving as a foundation. Thus, the relaxed AlN intermediate layer 52 is formed on the GaN foundation layer 61.

Next, an AlGaN intermediate layer 53 having a larger lattice constant than AlN is formed on the AlN intermediate layer 52. The thickness of the AlGaN intermediate layer 53 is preferably e.g. 5 nm or more and 2000 nm or less. If the thickness of the AlGaN intermediate layer 53 is thinner than 5 nm, it is difficult to achieve the effect of suppressing the generation of cracks and the effect of dislocation reduction. If the thickness of the AlGaN intermediate layer 53 is thicker than 2000 nm, the effect of dislocation reduction is saturated, and furthermore, cracks are likely to occur. More preferably, the thickness of the AlGaN intermediate layer 53 is less than 100 nm. By setting the thickness of the AlGaN intermediate layer 53 to less than 100 nm, the dislocation density can be effectively reduced. The thickness of the AlGaN intermediate layer 53 is e.g. approximately 13 nm.

In the state of thin thickness, i.e., in the initial phase of growth, $Al_xGa_{1-x}N$ is formed in lattice matching with the lattice constant of AlN, and grown under compressive strain. That is, the lattice constant of the a-axis of $Al_xGa_{1-x}N$ is closer to the lattice constant of the a-axis of AlN compared with the lattice constant of the a-axis of GaN. With the progress of the growth of $Al_xGa_{1-x}N$, the strain is gradually relaxed. Thus, $Al_xGa_{1-x}N$ comes to have the lattice constant of $Al_xGa_{1-x}N$ free from strain.

The formation temperature of the AlGaN intermediate layer 53 is e.g. approximately 1130° C. If the formation temperature of the AlGaN intermediate layer 53 is 80° C. or more higher than the formation temperature of the AlN intermediate layer 52, the effect of growing in lattice matching with the lattice constant of AlN is achieved more significantly. That is, the compressive strain is applied and the effect suppressing the crack is likely to be obtained. Furthermore, the effect of dislocations reduction is achieved more significantly.

Next, on the relaxed AlGaN intermediate layer 53, a GaN intermediate layer 51 having a larger lattice constant than the AlGaN intermediate layer 53 is formed. In the initial phase of growth, the GaN intermediate layer 51 is formed in lattice matching with the lattice constant of $Al_xGa_{1-x}N$, and grown under compressive strain. With the progress of the growth of GaN, the strain is gradually relaxed. Thus, the lattice constant of GaN returns to the lattice constant of GaN free from strain.

As shown in FIG. 16C, the formation temperature of the GaN intermediate layer 51 is e.g. approximately 1130° C. If the formation temperature of the GaN intermediate layer 51 is 200° C. or more higher than the formation temperature of the AlN intermediate layer 52, the thickness grown in lattice matching with the lattice constant of $Al_xGa_{1-x}N$ is increased. As a result, compressive strain is easily applied during crystal growth of the GaN intermediate layer 51. Thus, the effect of suppressing the generation of cracks is achieved more significantly. The thickness of the GaN intermediate layer 51 is e.g. approximately 260 nm.

The nitride semiconductor wafer 210 as described above can provide a nitride semiconductor wafer for a nitride semiconductor device formed on a silicon substrate, including few cracks and dislocations, and having high quality.

Third Embodiment

Figure 17:
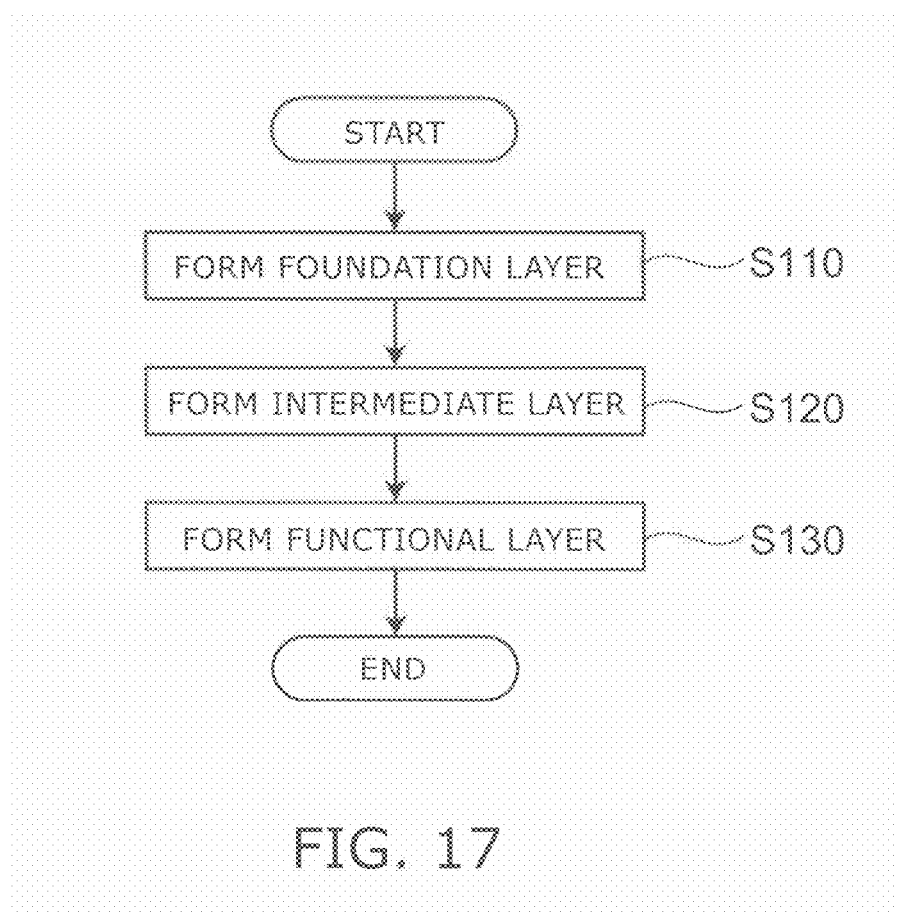
FIG. 17 is a flow chart illustrating a method for manufacturing a nitride semiconductor layer according to a third embodiment.

FIG. 17 is a flow chart illustrating a method for manufacturing a nitride semiconductor layer according to a third embodiment.

As shown in FIG. 17, in this manufacturing method, a foundation layer 60 is formed on a silicon substrate 40 (step S110). Next, on the foundation layer 60, a stacked intermediate layer 50 is formed (step S120). Next, on stacked intermediate layer 50, a functional layer 10 is formed (step S130).

The formation of the foundation layer 60 includes forming an AlN buffer layer 62 having a thickness of approximately 30 nm and forming a GaN foundation layer 61 having a thickness of approximately 300 nm on the AlN buffer layer 62. Alternatively, the formation of the foundation layer 60 includes forming an AlN buffer layer 62 having a thickness of approximately 30 nm, forming an AlGaN foundation layer 63 having a thickness of approximately 40 nm on the AlN buffer layer 62, and forming a GaN foundation layer 61 having a thickness of approximately 300 nm on the AlGaN foundation layer 63.

The formation of the stacked intermediate layer 50 includes forming an AlN intermediate layer 52 having a thickness of 5 nm or more and 100 nm or less on the GaN foundation layer 61 at a formation temperature of 500° C. or more and 1050° C. or less. The formation of the stacked intermediate layer 50 includes forming an AlGaN intermediate layer 53 having a thickness of 5 nm or more and 2000 nm or less on the AlN intermediate layer 52 at a formation temperature being 80° C. or more higher than the formation temperature of the AlN intermediate layer 52. The formation of the stacked intermediate layer 50 includes forming a GaN intermediate layer 51 having a thickness of approximately 260 nm on the AlGaN intermediate layer 53 at a formation temperature being 80° C. or more higher than the formation temperature of the AlN intermediate layer 52.

Alternatively, the formation of the stacked intermediate layer 50 includes periodically stacking the AlN intermediate layer 52, the AlGaN intermediate layer 53, and the GaN intermediate layer 51 in this order a plurality of times.

This manufacturing method can manufacture a nitride semiconductor layer formed on a silicon substrate, including few cracks and dislocations, and having high quality.

In the embodiment, growth of semiconductor layers can be based on e.g. the metal-organic chemical vapor deposition (MOCVD), metal-organic vapor phase epitaxy (MOVPE), molecular beam epitaxy (MBE), and halide vapor phase epitaxy (HVPE).

For instance, in the case of using the MOCVD or MOVPE, the following raw materials can be used in forming each semiconductor layer. As a raw material of Ga, for instance, TMGa (trimethylgallium) and TEGa (triethylgallium) can be used. As a raw material of 1n, for instance, TMIn (trimethylindium) and TEIn (triethylindium) can be used. As a raw material of Al, for instance, TMAl (trimethylaluminum) can be used. As a raw material of N, for instance, $NH_3$ (ammonia), MMHy (monomethylhydrazine), and DMHy (dimethylhydrazine) can be used. As a raw material of Si, for instance, $SiH_4$ (monosilane) and $Si_2H_6$ (disilane) can be used.

The embodiments can provide a nitride semiconductor device, a nitride semiconductor wafer, and a method for manufacturing a nitride semiconductor layer formed on a silicon substrate, including few cracks and dislocations, and having high quality.

In the description, the "nitride semiconductor" includes semiconductors of the chemical formula $B_xIn_yAl_zGa_{1-x-y-z}N$ ($0 \leq x \leq 1$, $0 \leq y \leq 1$, $0 \leq z \leq 1$, $x+y+z \leq 1$) of any compositions with the composition ratios x, y, and z varied in the respective ranges. Furthermore, the "nitride semiconductor" also includes those of the above chemical formula further containing group V elements other than N (nitrogen), those further containing various elements added for controlling various material properties such as conductivity type, and those further containing various unintended elements.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

In the specification of the application, "the lattice constant" and "the lattice spacing" are not limited to strictly the lattice spacing peculiar to material. For example, "the lattice constant of AlN not affected by strain" means that coherent growth from e.g. GaN foundation layer is not completely performed. Even if 100% lattice relaxation does not occur, it is sufficient that substantially lattice relaxation occurs.

In the thin-film layer like AlN intermediate layer, AlGaN intermediate layer, and GaN intermediate layer, an atom is spread involuntarily between contiguity layers after form, and the composition can vary without departing from the effect of the inventions. This case is also included in the scope of the invention to the extent that the purport of the invention is included.

The embodiments of the invention have been described above with reference to examples. However, the invention is not limited to these examples. For instance, any specific configurations of various components such as the substrate, AlN buffer layer, AlGaN foundation layer, GaN foundation layer, AlN intermediate layer, AlGaN intermediate layer, GaN intermediate layer, and functional layer included in the nitride semiconductor device and wafer are encompassed within the scope of the invention as long as those skilled in the art can similarly practice the invention and achieve similar effects by suitably selecting such configurations from conventionally known ones.

Further, any two or more components of the specific examples may be combined within the extent of technical feasibility and are included in the scope of the invention to the extent that the purport of the invention is included.

In addition, those skilled in the art can suitably modify and implement the nitride semiconductor device, the nitride semiconductor wafer, and the method for manufacturing a nitride semiconductor layer described above in the embodiments of the invention. All the nitride semiconductor devices, the nitride semiconductor wafers, and the methods for manufacturing a nitride semiconductor layer thus modified are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nitride semiconductor device comprising:
   a foundation layer including an AlN buffer layer formed on a substrate;
   a first stacked intermediate layer provided on the foundation layer, the first stacked intermediate layer including:
     a first AlN intermediate layer including Al provided on the foundation layer;
     a first AlGaN intermediate layer provided on the first AlN intermediate layer; and
     a first GaN intermediate layer provided on the first AlGaN intermediate layer; and
   a functional layer provided on the first stacked intermediate layer,
   the first AlGaN intermediate layer being in contact with the first AlN intermediate layer, and
   an Al composition ratio in the first AlGaN intermediate layer being lower than an Al composition ratio in the first AlN intermediate layer.

2. The device according to claim 1, wherein
   the first AlGaN intermediate layer includes a first layer and a second layer, the first layer being in contact with the first AlN intermediate layer, the second layer being provided on the first layer,
   an Al composition ratio in the first layer decreases stepwise relative to an Al composition ratio in the first AlN intermediate layer, and
   an Al composition ratio in the second layer gradually decreases from the first layer.

3. The device according to claim 1, further comprising:
   a second stacked intermediate layer provided between the first stacked intermediate layer and the functional layer, the second stacked intermediate layer including:
     a second AlN intermediate layer including Al provided on the first GaN intermediate layer;
     a second AlGaN intermediate layer provided on the second AlN intermediate layer; and
     a second GaN intermediate layer provided on the second AlGaN intermediate layer,
   the second AlGaN intermediate layer being in contact with the second AlN intermediate layer, and
   an Al composition ratio in the second AlGaN intermediate layer being lower than an Al composition ratio in the second AlN intermediate layer.

4. The device according to claim 1, wherein the first AlGaN intermediate layer has a thickness of 5 nanometers or more and 2000 nanometers or less.

5. The device according to claim 1, wherein the first AlN intermediate layer has a thickness of 5 nanometers or more and 100 nanometers or less.

6. The device according to claim 1, wherein the first AlN intermediate layer is formed at a temperature being 80° C. or more lower than a temperature at which the first GaN intermediate layer is formed.

7. The device according to claim 1, wherein the first AlN intermediate layer is formed at a temperature of 500° C. or more and 1050° C. or less.

8. The device according to claim 1, wherein the first AlN intermediate layer is formed at a temperature being 80° C. or more lower than a temperature at which the first AlGaN intermediate layer is formed.

9. A nitride semiconductor device comprising:
a foundation layer including an AlN buffer layer formed on a substrate;
a first stacked intermediate layer provided on the foundation layer, the first stacked intermediate layer including:
   a first AlGaN-based intermediate layer provided on the foundation layer; and
   a first GaN intermediate layer provided on the first AlGaN-based intermediate layer; and
a functional layer provided on the first stacked intermediate layer,
absolute value of difference between an a-axis lattice constant of the first AlGaN-based intermediate layer and an a-axis lattice constant of GaN being larger than absolute value of difference between the a-axis lattice constant of the first AlGaN-based intermediate layer and an a-axis lattice constant of AlN.

10. The device according to claim 9, wherein
the first AlGaN-based intermediate layer includes
   a first AlN intermediate layer having a thickness of 5 nanometers or more and 100 nanometers or less,
   a first AlGaN intermediate layer having a thickness of 5 nanometers or more and 2000 nanometers or less.

11. The device according to claim 9, further comprising: a second stacked intermediate layer provided between the first stacked intermediate layer and the functional layer,
the second stacked intermediate layer including:
   a second AlGaN-based intermediate layer provided on the first GaN intermediate layer; and
   a second GaN intermediate layer provided on the second AlGaN-based intermediate layer,
absolute value of difference between an a-axis lattice constant of the second AlGaN-based intermediate layer and the a-axis lattice constant of the GaN being larger than absolute value of difference between the a-axis lattice constant of the second AlGaN-based intermediate layer and the a-axis lattice constant of the AlN,
a RMS value of surface height of the second AlGaN-based intermediate layer being 1 nanometer or less.

12. The device according to claim 1, wherein a surface of the first AlGaN intermediate layer is flatter than a surface of the first AlN intermediate layer.

13. The device according to claim 1, wherein a RMS value of surface height of the first AlGaN intermediate layer is 1 nanometer or less.

14. A nitride semiconductor wafer comprising:
a substrate;
a foundation layer including an AlN buffer layer provided on the substrate;
a stacked intermediate layer provided on the foundation layer, the stacked intermediate layer including:
   an AlN intermediate layer including Al provided on the foundation layer;
   an AlGaN intermediate layer provided on the AlN intermediate layer; and
   a GaN intermediate layer provided on the AlGaN intermediate layer; and
a functional layer provided on the stacked intermediate layer,
the AlGaN intermediate layer being in contact with the AlN intermediate layer, and
an Al composition ratio in the AlGaN intermediate layer being lower than an Al composition ratio in the AlN intermediate layer.

15. The wafer according to claim 14, wherein
the AlGaN intermediate layer includes a first layer and a second layer, the first layer being in contact with the AlN intermediate layer, the second layer being provided on the first layer,
an Al composition ratio in the first layer decreases stepwise relative to an Al composition ratio in the AlN intermediate layer, and
an Al composition ratio in the second layer gradually decreases from the first layer.

16. The wafer according to claim 14, wherein the AlN intermediate layer is formed at a temperature being 80° C. or more lower than a temperature at which the GaN intermediate layer is formed.

17. The wafer according to claim 14, wherein the AlGaN intermediate layer has a thickness of 5 nanometers or more and 2000 nanometers or less.

18. The wafer according to claim 14, wherein the AlN intermediate layer is formed at a temperature of 500° C. or more and 1050° C. or less.

19. The wafer according to claim 14, wherein the AlN intermediate layer is formed at a temperature being 80° C. or more lower than a temperature at which the AlGaN intermediate layer is formed.

20. The wafer according to claim 14, wherein the AlN intermediate layer is formed at a temperature being 200° C. or more lower than a temperature at which the GaN intermediate layer is formed.

21. A nitride semiconductor wafer comprising:
a substrate;
a foundation layer including an AlN buffer layer formed on the substrate;
a stacked intermediate layer provided on the foundation layer, the stacked intermediate layer including:
   an AlGaN-based intermediate layer provided on the foundation layer; and
   a GaN intermediate layer provided on the AlGaN-based intermediate layer; and
a functional layer provided on the stacked intermediate layer,
absolute value of difference between an a-axis lattice constant of the AlGaN-based intermediate layer and an a-axis lattice constant of GaN being larger than absolute value of difference between the a-axis lattice constant of the AlGaN-based intermediate layer and an a-axis lattice constant of AlN.

22. The wafer according to claim 21, wherein
the AlGaN-based intermediate layer includes
   an AlN intermediate layer having a thickness of 5 nanometers or more and 100 nanometers or less,
   an AlGaN intermediate layer having a thickness of 5 nanometers or more and 2000 nanometers or less.

23. The wafer according to claim 22, wherein a surface of the AlGaN intermediate layer is flatter than a surface of the AlN intermediate layer.

24. The wafer according to claim 22, wherein a RMS value of surface height of the AlGaN intermediate layer is 1 nanometer or less.

25. A method for manufacturing a nitride semiconductor layer, comprising:
a first step to form a foundation layer including an AlN buffer layer on a silicon substrate;
a second step to form a stacked intermediate layer by:
   forming an AlN intermediate layer on the foundation layer at 500° C. or more and 1050° C. or less;
   forming an AlGaN intermediate layer on the AlN intermediate layer at a temperature being 80° C. or more higher than a temperature for forming the AlN intermediate layer, the AlGaN intermediate layer including a step layer in contact with the AlN intermediate layer; and forming a GaN intermediate layer on the AlGaN intermediate layer at a temperature being 80° C. or more higher than the temperature for forming the AlN intermediate layer; and a third step to form a functional layer on the stacked intermediate layer, an Al composition ratio in the step layer being decreased stepwise in a stacking direction from the AlN intermediate layer toward the step layer.

26. The method according to claim 25, wherein in the second step, a gradient layer is further formed between the step layer and the GaN intermediate layer, and an Al composition ratio in the gradient layer is gradually decreased in the stacking direction.

27. The method according to claim 25, wherein the second step is repeated a plurality of times between the first step and the third step.

28. The method according to claim 25, wherein a thickness of the AlGaN intermediate layer is set to 5 nanometers or more and 2000 nanometers or less.

29. The method according to claim 25, wherein a thickness of the AlN intermediate layer is set to 5 nanometers or more and 100 nanometers or less.

30. A method for manufacturing a nitride semiconductor layer, comprising:

a first step to form a foundation layer including an AlN buffer layer on a silicon substrate;

a second step to form a stacked intermediate layer by:

forming an AlN intermediate layer on the foundation layer;

forming an AlGaN intermediate layer on the AlN intermediate layer, the AlGaN intermediate layer including a step layer in contact with the AlN intermediate layer; and forming a GaN intermediate layer on the AlGaN intermediate layer; and a third step to form a functional layer on the stacked intermediate layer, absolute value of difference between an a-axis lattice constant of the AlGaN-based intermediate layer and an a-axis lattice constant of GaN being set to be larger than absolute value of difference between the a-axis lattice constant of the AlGaN-based intermediate layer and an a-axis lattice constant of AlN.

31. The method according to claim 30, wherein a thickness of the AlN intermediate layer is set to be 5 nanometers or more and 100 nanometers or less, and a thickness of the AlGaN intermediate layer is set to be 5 nanometers or more and 2000 nanometers or less.

32. The method according to claim 30, wherein a surface of the AlGaN intermediate layer is set to be flatter than a surface of the AlN intermediate layer.

33. The method according to claim 30, wherein a RMS value of surface height of the AlGaN intermediate layer is set to be 1 nanometer or less.

* * * * *